(12) United States Patent
Goryu et al.

(10) Patent No.: US 11,156,654 B2
(45) Date of Patent: Oct. 26, 2021

(54) SEMICONDUCTOR DEVICE INSPECTION APPARATUS, SEMICONDUCTOR DEVICE INSPECTION METHOD, PROGRAM THEREOF, SEMICONDUCTOR APPARATUS, AND MANUFACTURING METHOD THEREFOR

(71) Applicant: KABUSHIKI KAISHA TOSHIBA, Tokyo (JP)

(72) Inventors: Akihiro Goryu, Kawasaki Kanagawa (JP); Mitsuaki Kato, Kawasaki Kanagawa (JP); Akira Kano, Kawasaki Kanagawa (JP); Kenji Hirohata, Koto Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 602 days.

(21) Appl. No.: 15/911,550

(22) Filed: Mar. 5, 2018

(65) Prior Publication Data
US 2019/0064248 A1 Feb. 28, 2019

(30) Foreign Application Priority Data
Aug. 23, 2017 (JP) .............................. JP2017-159922

(51) Int. Cl.
*G01R 31/26* (2020.01)
*H01L 21/66* (2006.01)
*H01L 29/16* (2006.01)

(52) U.S. Cl.
CPC ..... *G01R 31/2607* (2013.01); *G01R 31/2648* (2013.01); *H01L 22/14* (2013.01); *H01L 29/1608* (2013.01)

(58) Field of Classification Search
CPC . G01R 31/2607; G01R 31/2648; H01L 22/14; H01L 29/1608
(Continued)

(56) References Cited

U.S. PATENT DOCUMENTS

| | | | |
|---|---|---|---|
| 6,538,462 B1 * | 3/2003 | Lagowski | H01L 22/14 257/E21.531 |
| 8,450,146 B2 | 5/2013 | Tanaka et al. | |

(Continued)

FOREIGN PATENT DOCUMENTS

| | | |
|---|---|---|
| JP | 02-154991 A | 6/1990 |
| JP | 03-046261 A | 2/1991 |

(Continued)

*Primary Examiner* — Farhana A Hoque
(74) *Attorney, Agent, or Firm* — Finnegan, Henderson, Farabow, Garrett & Dunner L.L.P.

(57) ABSTRACT

A semiconductor device inspection apparatus according to embodiments comprises: an action unit that generates an internal stress in a predetermined direction in a semiconductor device; a stress controller that controls a magnitude of the internal stress generated in the semiconductor device by the action unit; a probe electrically connected to the semiconductor device; a probe controller that supplies a current to the semiconductor device via the probe; and a controller that screens the semiconductor device based on a first current flowing through the semiconductor device via the probe while the internal stress is not generated in the semiconductor device and a second current flowing through the semiconductor device via the probe while the action unit generates the internal stress in the semiconductor device.

12 Claims, 15 Drawing Sheets

(58) Field of Classification Search
USPC .................................................. 324/762.01
See application file for complete search history.

(56) References Cited

U.S. PATENT DOCUMENTS

| | | | |
|---|---|---|---|
| 9,184,229 | B2 | 11/2015 | Ota et al. |
| 2004/0018668 | A1 | 1/2004 | Maszara |
| 2006/0199310 | A1 | 9/2006 | Nakabayashi et al. |
| 2007/0108526 | A1 | 5/2007 | Kohyama |
| 2012/0262715 | A1* | 10/2012 | Sakai ................. G01L 1/241 356/369 |
| 2014/0377798 | A1 | 12/2014 | Ertl et al. |
| 2015/0128709 | A1* | 5/2015 | Stewart .............. G01N 29/045 73/588 |
| 2016/0003889 | A1 | 1/2016 | Watanabe et al. |
| 2017/0218417 | A1 | 8/2017 | Ertl et al. |

FOREIGN PATENT DOCUMENTS

| | | |
|---|---|---|
| JP | 08-086537 A | 4/1996 |
| JP | 2004-096034 A | 3/2004 |
| JP | 2005-531144 A | 10/2005 |
| JP | 2006-245408 A | 9/2006 |
| JP | 2007-158322 A | 6/2007 |
| JP | 2007-318031 A | 12/2007 |
| JP | 2008-305880 A | 12/2008 |
| JP | 2010-48599 A | 3/2010 |
| JP | 2010-199377 A | 9/2010 |
| JP | 4879507 B2 | 2/2012 |
| JP | 4886761 B2 | 2/2012 |
| JP | 2012-158643 A | 8/2012 |
| JP | 2014-045167 A | 3/2014 |
| JP | 2014-090057 A | 5/2014 |
| JP | 2015-506707 A | 3/2015 |
| JP | 5980024 B2 | 8/2016 |
| JP | 6104363 B2 | 3/2017 |

* cited by examiner

FIG.12
(a)
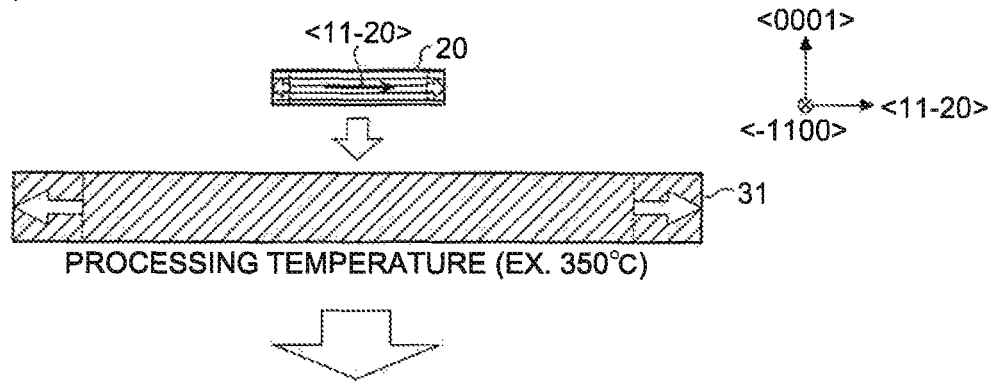
(b)
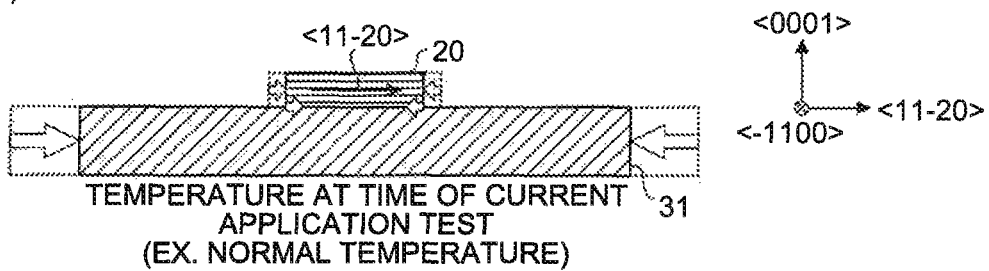
FIG.13
(a)
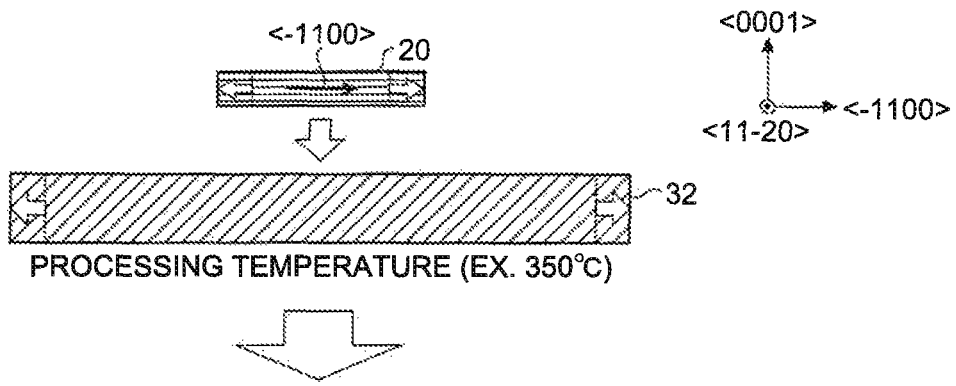
(b)
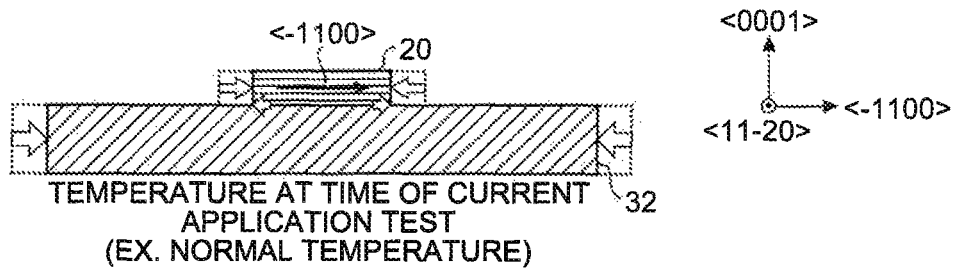

FIG.14
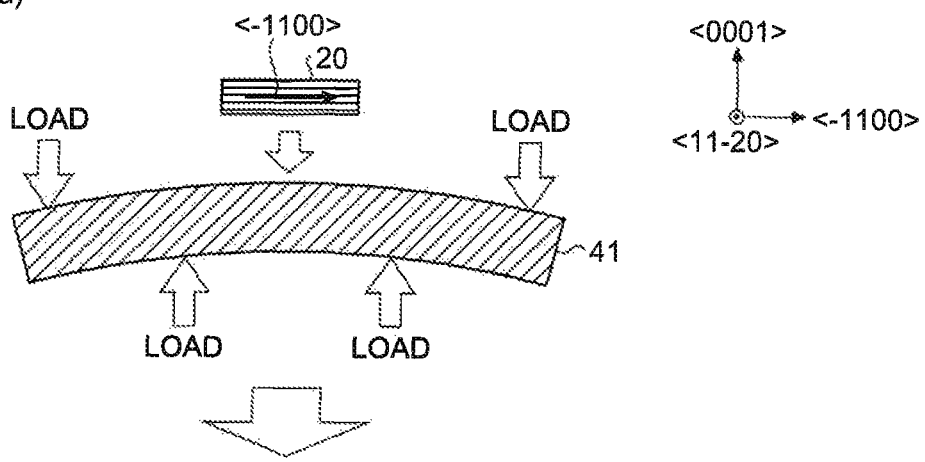
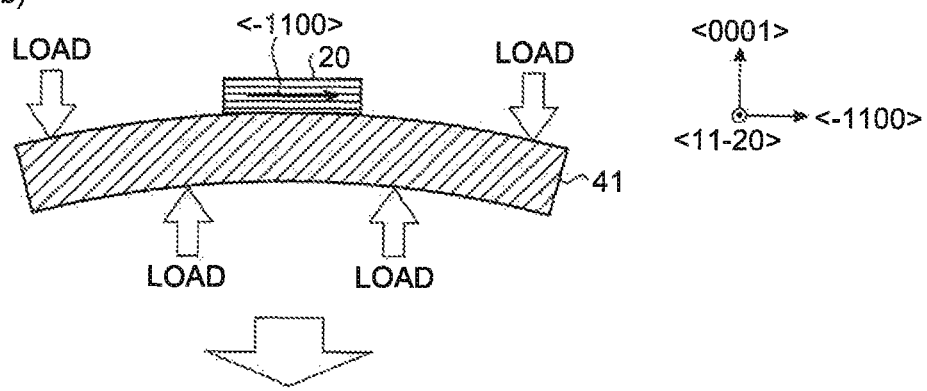
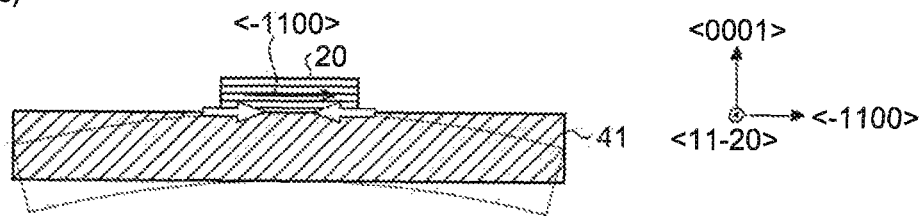

FIG.15
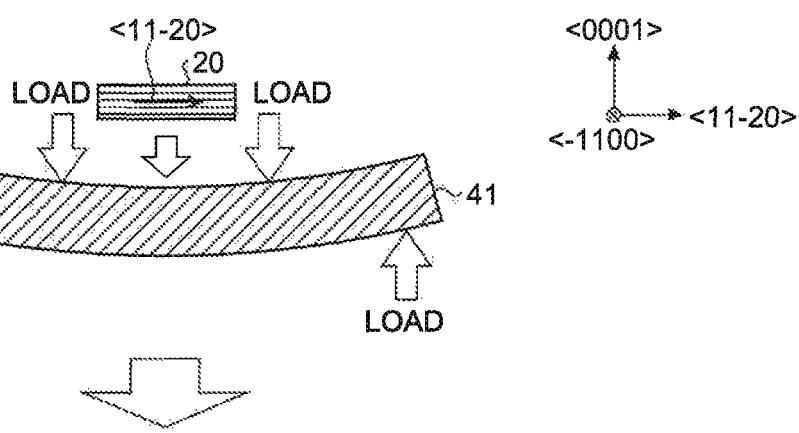
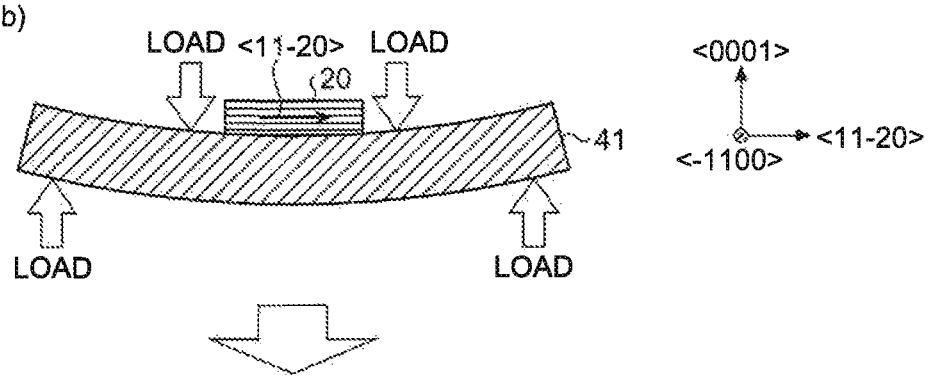
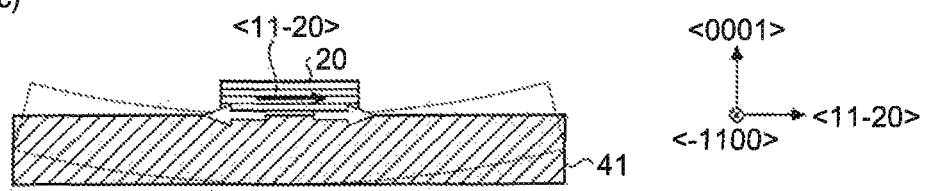

FIG.18
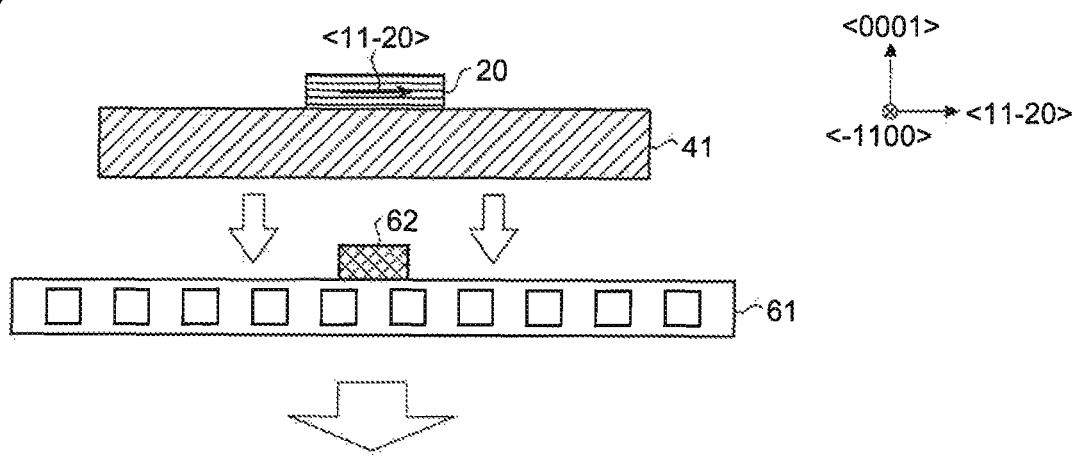
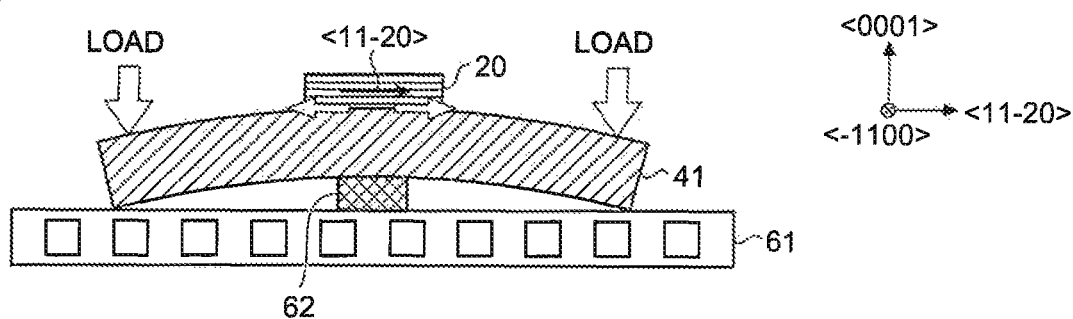

FIG.19
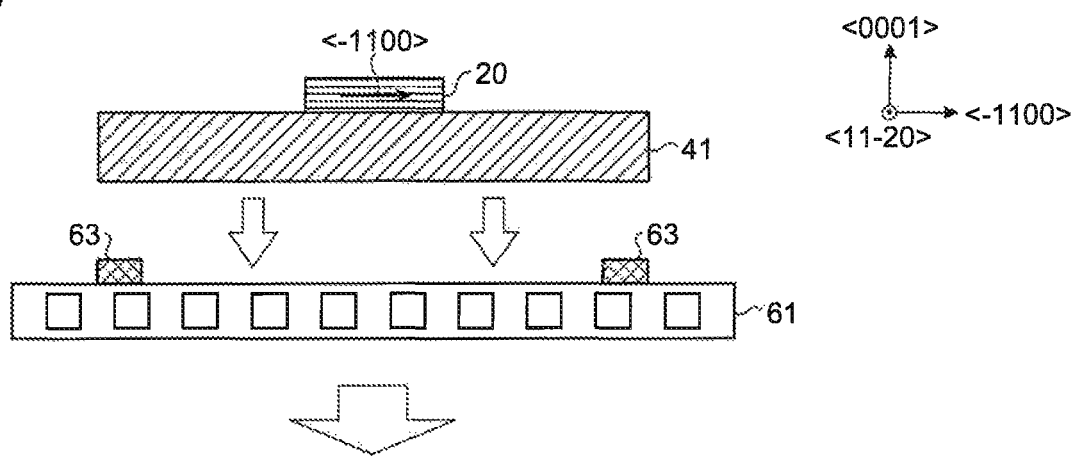
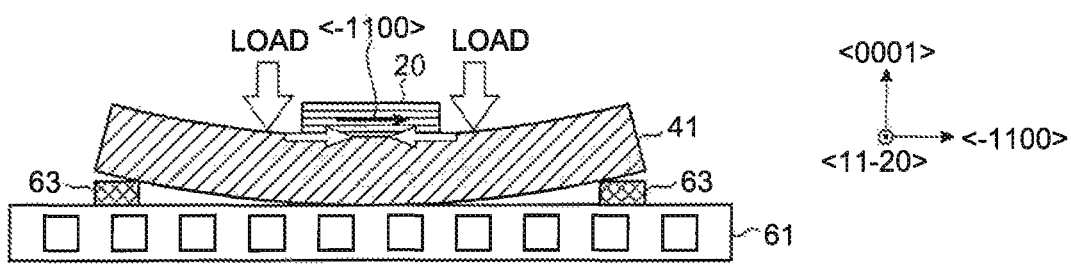

FIG.20
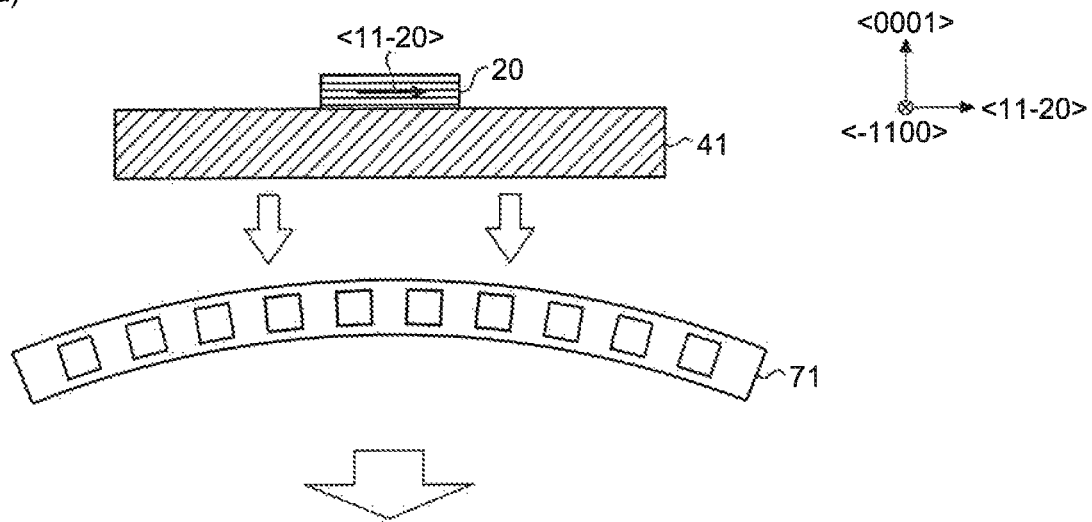
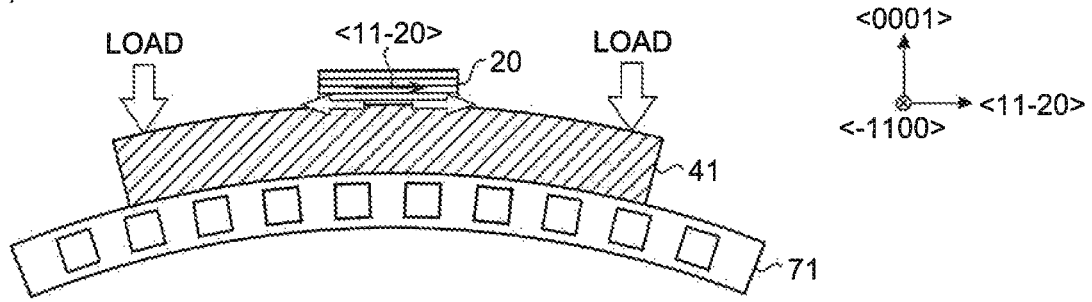

FIG.21
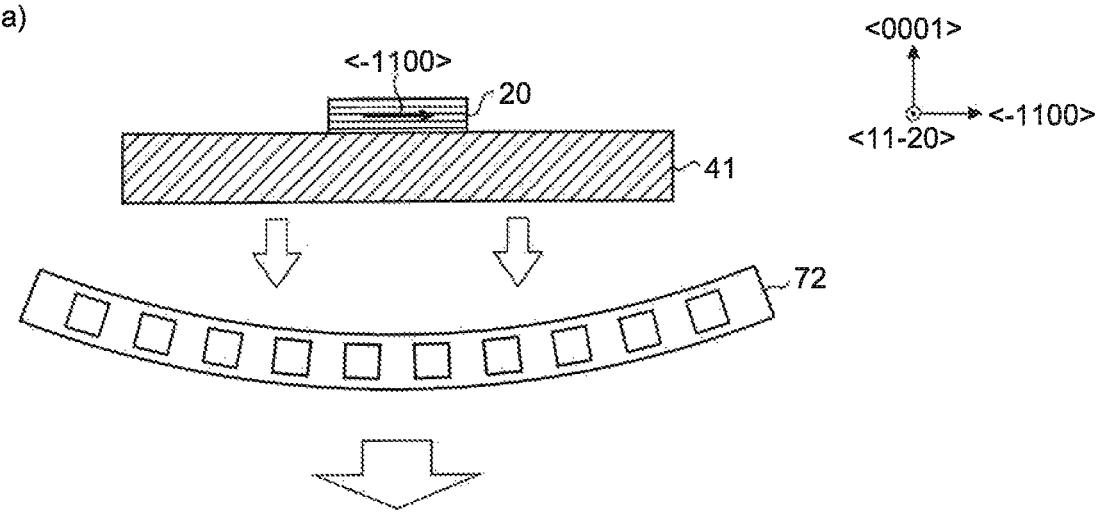
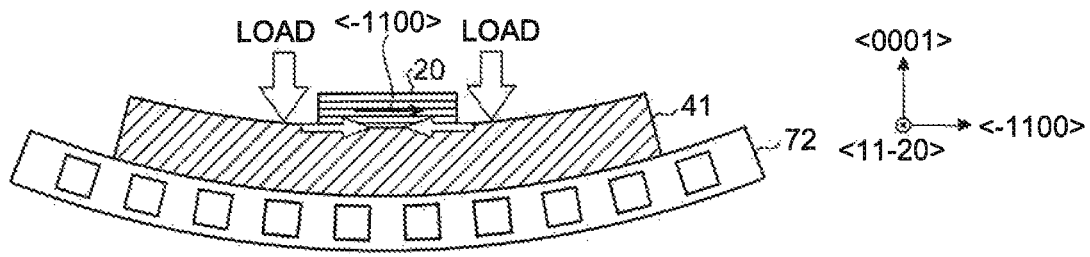

SEMICONDUCTOR DEVICE INSPECTION APPARATUS, SEMICONDUCTOR DEVICE INSPECTION METHOD, PROGRAM THEREOF, SEMICONDUCTOR APPARATUS, AND MANUFACTURING METHOD THEREFOR

CROSS-REFERENCE TO RELATED APPLICATIONS

This application is based upon and claims the benefit of priority from Japanese Patent Application No. 2017-159922, filed on Aug. 23, 2017; the entire contents of which are incorporated herein by reference.

FIELD

Embodiments described herein relate generally to a semiconductor device inspection apparatus, a semiconductor device inspection method, a program thereof, a semiconductor apparatus, and a manufacturing method therefor.

BACKGROUND

Silicon carbide (SiC) has a dielectric breakdown electric field strength about 10 times that of silicon (Si) and in addition, it is a semiconductor having excellent physical properties also in thermal conductivity, electron mobility, band gap and the like. Therefore, it is expected as a semiconductor material that achieves drastic performance improvement compared with the conventional Si-based power semiconductor element.

Semiconductor elements are broadly classified into unipolar type semiconductor elements in which only either electrons or holes are affected by electric conduction when current is applied and bipolar type semiconductor elements in which both electrons and holes are affected by electric conduction. A Schottky barrier diode (SBD), a junction field effect transistor (J-FET), a metal/oxide film/semiconductor field effect transistor (MOS-FET) and the like belong to the unipolar type semiconductor element. A pn diode, a bipolar junction transistor (BJT), a thyristor, a gate turn-off thyristor (GTO thyristor), an insulated gate bipolar transistor (IGBT) and the like belong to the bipolar type semiconductor element.

BRIEF DESCRIPTION OF THE DRAWINGS

FIG. 12 is a diagram for explaining an internal stress generated in a semiconductor device when the semiconductor device is mounted on a base substrate having a linear expansion coefficient larger than that of a SiC substrate in a third embodiment;

FIG. 13 is a diagram for explaining an internal stress generated in a semiconductor device when the semiconductor device is mounted on a base substrate having a linear expansion coefficient smaller than that of a SiC substrate in the third embodiment;

FIG. 14 is a diagram for explaining an example of a semiconductor apparatus according to a fourth embodiment;

FIG. 15 is a diagram for explaining another example of the semiconductor apparatus according to the fourth embodiment;

FIG. 18 is a diagram for explaining an example of a semiconductor apparatus according to a sixth embodiment;

FIG. 19 is a diagram for explaining another example of the semiconductor apparatus according to the sixth embodiment;

FIG. 20 is a diagram for explaining an example of a semiconductor apparatus according to a modification of the sixth embodiment;

FIG. 21 is a diagram for explaining another example of the semiconductor apparatus according to the modification of the sixth embodiment;

DETAILED DESCRIPTION

Figure 1:
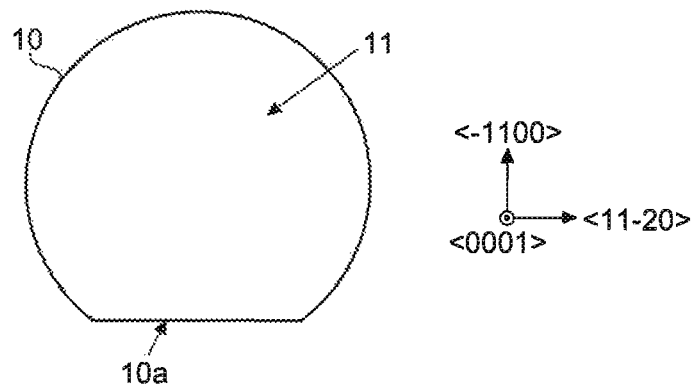
FIG. 1 is a top view illustrating an example of a SiC wafer in which a semiconductor device according to an embodiment is to be built.

Hereinafter, a semiconductor device inspection apparatus, a semiconductor device inspection method, a program thereof, a semiconductor apparatus, and a manufacturing method therefor according to the exemplified embodiments will be described in detail with reference to the accompanying drawings.

As described earlier, a SiC-based power semiconductor element in which SiC is used as the semiconductor material is characterized by being able to achieve a power semiconductor element drastically improved in the aspect of performance compared with a Si-based power semiconductor element in which Si is used as the semiconductor material. On the other hand, however, there are also disadvantages that various faults are present inside a SiC single crystal. Particularly, in a bipolar element such as a pn diode, an area near the interface between an n-type epitaxial film and a p-type epitaxial film or an area near the interface between the n-type epitaxial film and a p-type injection layer has a region where electrons and holes are recombined when electricity is applied. In this region, however, there is a problem that a basal plane dislocation (BPD) is converted into a stacking fault due to recombination energy of electrons and holes generated when electricity is applied.

The stacking fault is a planar fault having a triangular shape or the like. Meanwhile, the basal plane dislocation (BPD) is a dislocation existing in a decomposed state into two Shockley-type partial dislocations on a (0001) plane (also referred to as Si plane) which is a basal plane of a SiC single crystal. The planar stacking fault exists in a minute region sandwiched between the two Shockley-type partial dislocations. Such a stacking fault is called a Shockley-type stacking fault. It is believed that the area of the stacking fault increases as the partial dislocations move due to the recombination energy of electrons and holes.

Such a stacking fault region acts as a high resistance region when current is applied. Therefore, when the area of the stacking fault is enlarged, the forward voltage of the bipolar type semiconductor element is increased and, as a result, a failure that the element characteristics are degraded occurs.

As described above, various types of crystal defects occur inside the SiC single crystal during a process of forming a SiC single crystal substrate, a process of forming a SiC epitaxial film, a process of working a SiC substrate and the like and these crystal defects cause the lowering of the characteristics of the produced bipolar type semiconductor device. In particular, there is a problem that the crystal defects (the basal plane dislocations and the like) existing inside the SiC epitaxial film change to the planar stacking fault when current is applied and, as the area of this stacking fault is enlarged, the forward voltage is increased and the element characteristics are lowered.

However, the enlargement of the stacking fault has a certain current threshold value and has a feature that the stacking fault does not develop within a range not exceeding this threshold value.

In addition, the inventors of the present embodiment have succeeded in experimentally finding out that the stress generated inside the crystal affects the development of the stacking fault. For example, the inventors of the present embodiment experimentally found out that, when a compressive force or a tensile force is applied to a crystal sample having an off angle in the <11-20> direction with respect to the (0001) plane as the basal plane, the phenomenon that the threshold value of the current at the occurrence of the stacking fault increases or decreases occurs.

Therefore, some embodiments indicated below make it possible to screen an individual having a large degree of occurrence of crystal defects, which causes deterioration of characteristics, by performing a current application test while an internal stress is generated in the semiconductor device. In addition, in some embodiments indicated below, in order to suppress the occurrence of the stacking fault, the direction of the internal stress generated in the semiconductor device is controlled at a semiconductor device level or a product level.

First Embodiment

Figure 2:
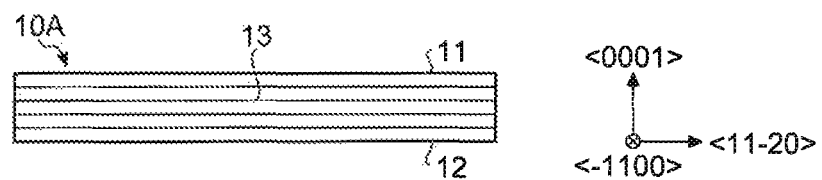
FIG. 2 is a cross-sectional view of a SiC wafer as an on-substrate taken along a (0001) plane.
Figure 3:
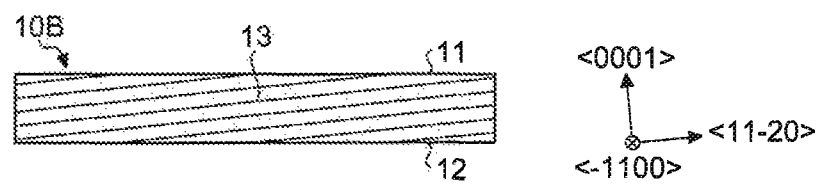
FIG. 3 is a cross-sectional view of a SiC wafer as an off-substrate taken along the (0001) plane.

FIGS. 1 to 3 are diagrams illustrating examples of a SiC wafer in which a semiconductor device according to the present embodiment is to be built. FIG. 1 illustrates a top view of a SiC wafer 10, FIG. 2 illustrates a cross-sectional view of a SiC wafer 10A as an on-substrate taken along the (0001) plane, and FIG. 3 illustrates a cross-sectional view of a SiC wafer 10B as an off-substrate taken along the (0001) plane. Note that in the following description, a plane perpendicular to a <0001> direction in the crystal orientation of a SiC crystal is referred to as the (0001) plane, a plane perpendicular to the <11-20> direction is referred to as an (11-20) plane, and a plane perpendicular to a <−1100> direction is referred to as a (−1100) plane. In addition, the (0001) plane is also called a Si plane or the basal plane and a (000-1) plane is also called a C plane.

As illustrated in FIG. 1, in the SiC wafer 10 produced by slicing an ingot made of SiC, for example, a mark such as an orientation flat 10a or a notch is provided in a specific section of the SiC wafer 10 in order to specify the crystal orientation. In addition, in a case where an upper surface 11 and a bottom face 12 of the SiC wafer 10 cannot be distinguished, for example, when the upper surface and the bottom face thereof are both polished, there are also cases where a second orientation flat is provided at a position on the SiC wafer 10 located at a predetermined angle with respect to the orientation flat 10a.

Basically, the SiC wafer 10 is produced by slicing an ingot with a plane substantially parallel to the (0001) plane of the SiC crystal. Here, as illustrated in FIG. 2, the SiC wafer 10A in which the (0001) plane of the SiC crystal and sliced planes (the upper surface 11 and the bottom face 12) are parallel is referred to as the on-substrate. On the other hand, as illustrated in FIG. 3, the SiC wafer 10B in which the sliced planes (the upper surface 11 and the bottom face 12) are inclined with respect to the (0001) plane of the SiC crystal is referred to as the off-substrate.

Figure 4:
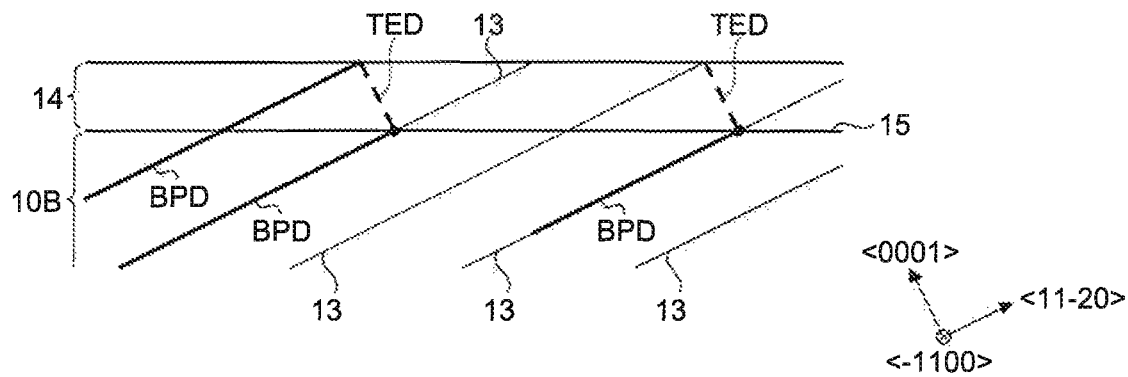
FIG. 4 is a diagram for explaining basal plane dislocations (BPD) and edge dislocations (TED) occurring in the off-substrate.

In the SiC wafer 10, the basal plane dislocation (BPD) existing in a decomposed state into the two Shockley-type partial dislocations occurs on the basal plane as mentioned above. For example, when the SiC wafer 10 is an off-substrate (SiC wafer 10B), as illustrated in FIG. 4, the basal plane dislocation (BPD) occurring on a basal plane 13 of the SiC wafer 10B sometimes extends to within a SiC epitaxial film 14 formed on the SiC wafer 10B. There are also cases where the basal plane dislocation (BPD) occurring on the basal plane 13 changes to an edge dislocation (TED) near an interface 15 between the SiC wafer 10B and the SiC epitaxial film 14 and extends to within the SiC epitaxial film 14.

The basal plane dislocation (BPD) is converted into the stacking fault due to the recombination energy of electrons and holes generated when electricity is applied to the semiconductor device produced from the SiC wafer 10. In addition, the stacking fault crows in some cases from a portion of the starting point where the basal plane dislocation (BPD) is converted into the edge dislocation (TED). The stacking fault existing within the crystal as described above causes degradation of the device characteristics of the semiconductor device.

Therefore, in this embodiment, a current application test is performed on a semiconductor device built in the SiC wafer 10 or a semiconductor chip obtained by singulating the semiconductor device while the internal stress is generated (hereinafter, for the sake of simplicity, the semiconductor device built in the SiC wafer 10 and the semiconductor chip obtained by singulating this semiconductor device are both referred to as semiconductor devices). This makes it possible to screen an individual having a large degree of occurrence of crystal defects which cause deterioration of characteristics, whereby the semiconductor device with low device characteristics or a high probability of the device characteristics being lowered can be excluded before being incorporated into electronic equipment or the like (hereinafter referred to as semiconductor apparatus). As a result, the reliability of a semiconductor device 20 and a semiconductor apparatus mounting the semiconductor device 20 can be improved.

Figure 5:
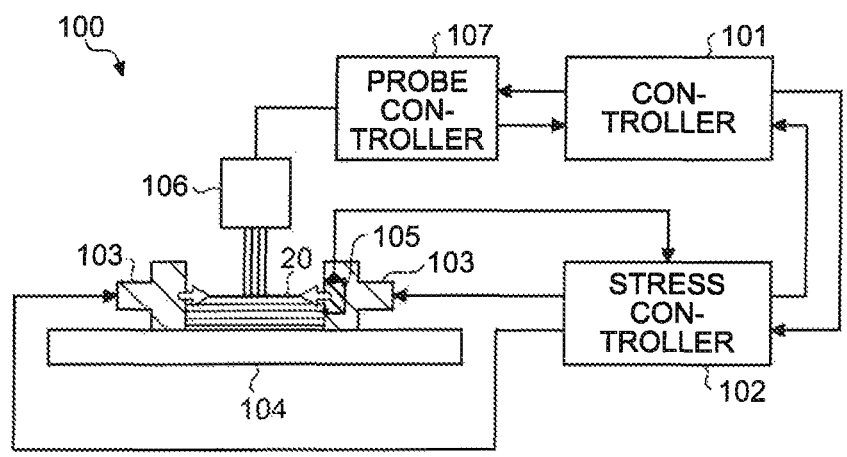
FIG. 5 is a block diagram illustrating a schematic configuration example of a semiconductor device inspection apparatus according to a first embodiment.

FIG. 5 is a block diagram illustrating a schematic configuration example of a semiconductor device inspection apparatus according to this embodiment. As illustrated in FIG. 5, the semiconductor device inspection apparatus 100 includes a controller 101, a stress controller 102, action units 103, a stage 104, a force sensor 105, a probe 106, and a probe controller 107. In this configuration, the controller 101 is constituted, for example, by an information processing apparatus such as a central processing unit (CPU) and executes control of each member constituting the semiconductor device inspection apparatus 100 and various types of computations. In addition, the semiconductor device 20 to be inspected is placed on the stage 104 while being sandwiched between the two action units 103.

The force sensor 105 is provided, for example, in at least one of the two action units 103 and measures the pressure imparted to the semiconductor device 20 by the two action units 103. Note that, in this description, the pressure includes the compressive force and the tensile force. In accordance with a command from the controller 101, the stress controller 102 controls the compressive force or the tensile force imparted to the semiconductor device 20 by the action unit 103, based on a pressure value detected by the force sensor 105. Consequently, the stress occurring inside the semiconductor device 20 (for example, a shear stress on a sliding surface in the SiC crystal) is controlled. Note that the stress controller 102 may output various items of information such as the pressure value detected by the force sensor 105 to the controller 101 as necessary.

The probe 106 is a current probe for executing a current application test on the semiconductor device 20 and includes one or more electrodes that can be electrically connected to one or more terminals included in the semiconductor device 20 placed on the stage 104. In accordance with a command from the controller 101, the probe controller 107 supplies a current to the semiconductor device 20 via the probe 106 and detects the value of a voltage applied at that time and the value of a current flowing through the semiconductor device 20 to output to the controller 101. Accordingly, the controller 101 can specify the device characteristics (for example, a current-voltage characteristic) of the semiconductor device 20 from the input voltage value and current value.

Figure 6:
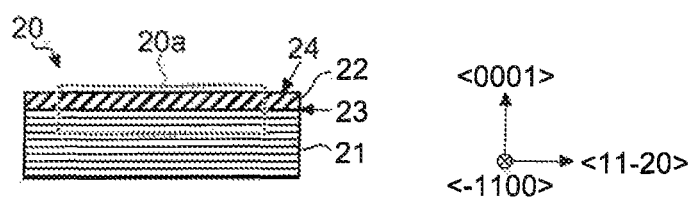
FIG. 6 is a cross-sectional view illustrating a schematic configuration example of a semiconductor device according to an embodiment.

The semiconductor device 20 to be inspected in this embodiment includes, as exemplified in FIG. 6, a SiC substrate 21 still in a wafer state or in a singulated state and a SiC epitaxial film 22 formed on an element formation surface of the SiC substrate 21. An element formation region 20a in which various semiconductor elements such as a unipolar type semiconductor element and a bipolar type semiconductor element are formed is provided in the element formation surface of the SiC substrate 21 and the SiC epitaxial film 22.

Figure 7:
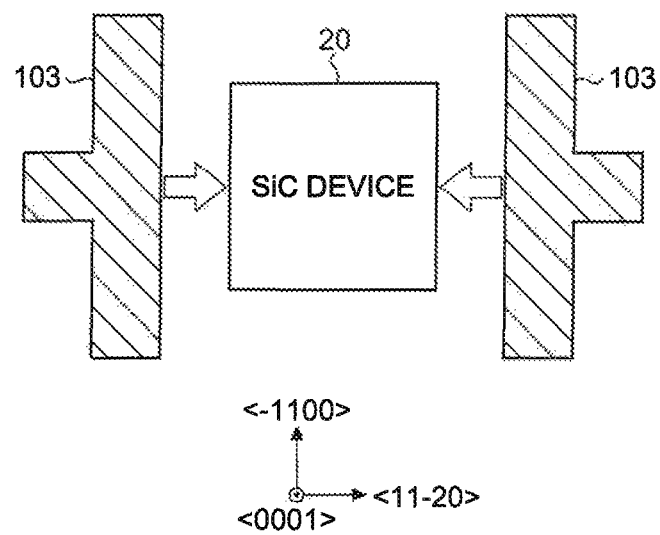
FIG. 7 is a schematic diagram for explaining a configuration that imparts a force having a component compressive in an <11-20> direction to the semiconductor device in the first embodiment.

Here, the SiC substrate 21 in this embodiment is an off-substrate whose sliced plane (equivalent to the element formation surface) has an off angle in the <11-20> direction with respect to the (0001) plane. In that case, as illustrated in FIG. 7, when a force having a component compressive in the <11-20> direction is imparted to the semiconductor device 20, the current threshold value at the occurrence of the stacking fault when electricity is applied decreases. On the other hand, when a force having a component tensile in the <11-20> direction is imparted to the semiconductor device 20, the current threshold value at the occurrence of the stacking fault when electricity is applied increases.

Figure 8:
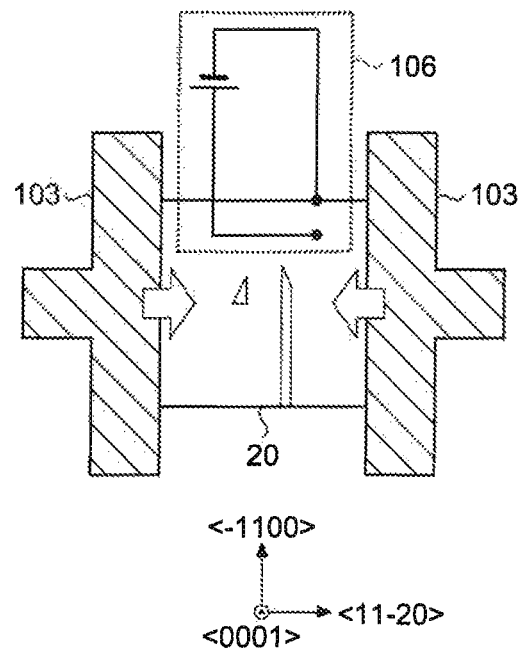
FIG. 8 is a schematic diagram for explaining a current application test carried out while a force having a component compressive in the <11-20> direction is being imparted to the semiconductor device in the first embodiment.

Therefore, in this embodiment, as illustrated in FIG. 8, the current application test using the probe 106 is carried out on the semiconductor device 20 for each of states before and after imparting a force having a component compressive in the <11-20> direction to the semiconductor device 20, that is, states before and after decreasing the current threshold value at the occurrence of the stacking fault. Consequently, it is possible to specify the semiconductor device 20 with low device characteristics or a high probability of the device characteristics being lowered based on a change in the current threshold value at the occurrence of the stacking fault and thus the semiconductor device 20 with better characteristics can be screened. As a result, the reliability of the semiconductor device 20 and a semiconductor apparatus mounting the semiconductor device 20 can be improved.

Figure 9:
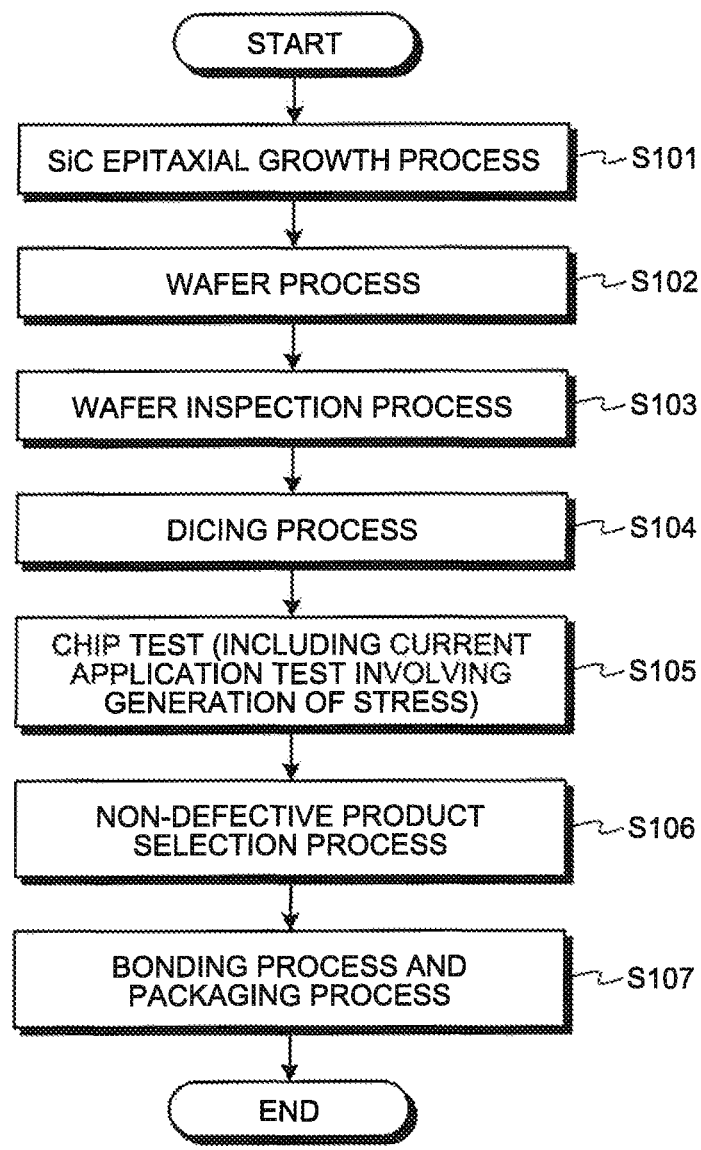
FIG. 9 is a flowchart illustrating an example of a flow of a manufacturing method for the semiconductor device according to the first embodiment.

Subsequently, a manufacturing method for the semiconductor device including an inspection method for the semiconductor device according to this embodiment will be described in detail with reference to the drawings. FIG. 9 is a flowchart illustrating an example of a flow of the manufacturing method for the semiconductor device according to this embodiment. Note that, in this description, it is assumed that the SiC wafer 10 as an off-substrate is prepared in advance.

As illustrated in FIG. 9, in the manufacturing process for the semiconductor device according to this embodiment, an epitaxial growth process is first executed to form the SiC epitaxial film 14 on the element formation surface (for example, the upper surface 11 in FIG. 1) of the SiC wafer 10 (S101). Subsequently, by executing a wafer process on the SiC wafer 10 on which the SiC epitaxial film 14 is formed, the semiconductor device 20 is built in each of a plurality of element formation regions 20a set in the SiC wafer 10 (step S102).

Next, an inspection (wafer inspection) is executed on the SiC wafer 10 in which the plurality of semiconductor devices 20 is built (step S103). In this wafer inspection, a current application test or the like is executed for each of the plurality of semiconductor devices 20 built in the SiC wafer 10 using a tester (not illustrated) or the like and, based on the result of this test, a non-defective product and a defective product are determined for each of the semiconductor devices 20.

Next, a dicing process of singulating the plurality of semiconductor devices 20 built in the SiC wafer 10 is executed (step S104). Methods such as cutting using a diamond blade or laser light, laser cutting, and chocolate break can be used for the dicing process. By this dicing process, the plurality of semiconductor devices 20 built in the SiC wafer 10 is singulated into individual semiconductor chips.

Next, a chip test is executed on the singulated semiconductor device 20 (step S105). In the chip test, for example, a function test and an accelerated test of temperature voltage stress are executed for the purpose of preventing initial defect. In addition, in the chip test according to this embodiment, the current application test, for example, using the semiconductor device inspection apparatus 100 exemplified in FIG. 5 is also executed on the semiconductor device 20. In this current application test, for example, the current application test using the probe 106 is executed for each of the states before and after applying pressure (compressive force) in a predetermined direction to the semiconductor device 20 using the action units 103 (refer to FIG. 5).

Here, the predetermined, direction in which the action units 103 applies pressure to the semiconductor device 20 may be a direction in which the direction of the shear stress on the sliding surface to be generated, for example, at least in an area from the vicinity of an interface 23 between the SiC substrate 21 and the SiC epitaxial film 22 to an upper surface 24 (refer to FIG. 6) is to be included, for example, within an angular range within ±15 degrees relative to the direction of development of the dislocation present on this sliding surface.

In other words, the predetermined direction may be a direction in which the shear stress on the (0001) plane is to be generated in an angular direction within, for example, ±15 degrees with respect to the <11-20> direction in the crystal orientation of the SiC substrate 21.

However, the predetermined direction is not limited to such a direction and various modifications can be made as long as the direction has a component compressive in the <11-20> direction in the crystal orientation of the SiC substrate 21. In addition, the pressure applied to the semiconductor devices 20 during the current application test is assumed to be controlled by the stress controller 102 based on the pressure value detected by the force sensor 105 to obtain a pressure that allows the internal stress generated in the semiconductor devices 20 to be equal to or lower than a breakdown stress of the semiconductor devices 20.

Next, based on the result of the chip test in step S105, a non-defective product selection process (screening process) is executed to exclude a defective product and select a non-defective product (step S106). This screening process also includes a process of excluding the semiconductor device 20 judged to have the stacking fault extended due to the application of pressure as a nonconforming product as a result of the current application test.

Note that, in the screening process, for example, the controller 101 (refer to FIG. 5) specifies the current-voltage characteristic of the semiconductor device 20 from the current detected by the probe controller 107 during the current application test in step S107 and the voltage applied at that time and judges the semiconductor device 20 whose current-voltage characteristic has fluctuated by a certain amount or more before and after the application of pressure as a nonconforming product. For example, in a case where a resistance value worked out from the current-voltage characteristic specified while the pressure is applied is increased from a resistance value worked out from the current-voltage characteristic specified while no pressure is applied by a predetermined threshold value or greater, the controller 101 judges this semiconductor device 20 as a nonconforming product.

Next, a bonding process of bonding the selected semiconductor device 20 to a base substrate such as a wiring substrate or a circuit substrate and a packaging process of packaging the bonded semiconductor device 20 with molding resin or the like are executed (step S107) and then this operation ends. Note that, besides wire bonding, various bonding methods such as face down bonding can be used for the bonding process. It is also possible to use a packaging technique such as a wafer level chip size package (WL-CSP).

As described above, in this embodiment, since the current application test is executed for the states before and after the internal stress is generated in the semiconductor device 20, it is possible to specify the semiconductor device 20 with low device characteristics or a high probability of the device characteristics being lowered based on a change in the current threshold value at the occurrence of the stacking fault. This makes it possible to screen the semiconductor device 20 with better device characteristics and, as a result, the reliability of the semiconductor device 20 and a semiconductor apparatus mounting the semiconductor device 20 can be improved.

Note that, the above-described embodiment exemplifies a case where pressure is applied to the semiconductor device 20 in a predetermined direction in which the shear stress on the sliding surface is to be generated, for example, at least in an area from the vicinity of the interface 23 (refer to FIG. 6) between the SiC substrate 21 and the SiC epitaxial film 22 to the upper surface 24, but is not limited thereto. Pressure may be applied to the semiconductor device 20, for example, in a direction in which the shear stress on the sliding surface is to be generated in a branch section (refer to FIG. 4) between the basal plane dislocation (BPD) and the edge dislocation (TED) existing in the vicinity of the interface 23 (refer to FIG. 6) between the SiC substrate 21 and the SiC epitaxial film 22.

In addition, the above-described embodiment exemplifies a case where the off-substrate whose sliced plane has an off angle in the <11-20> direction with respect to the (0001) plane is used as the SiC wafer 10 (or the SiC substrate 21), but is not limited thereto. It is also possible to use an off-substrate whose sliced plane has an off angle in the <-1100> direction with respect to the (0001) plane as the SiC wafer 10 (or the SiC substrate 21). In that case, when a force having a component tensile in the <-1100> direction (tensile force) is applied to the semiconductor device 20, the current threshold value at the occurrence of the stacking fault when electricity is applied decreases. On the other hand, when a force having a component compressive in the <-1100> direction (pressure) is applied to the semiconductor device 20, the current threshold value at the occurrence of the stacking fault when electricity is applied increases.

Also in such a case, the direction (predetermined direction) of the tensile force applied to the semiconductor device 20 during the current application test (step S107 in FIG. 9) may be a direction in which the direction of the shear stress on the sliding surface to be generated, for example, at least in an area from the vicinity of the interface 23 between the SiC substrate 21 and the SiC epitaxial film 22 to the upper surface 24 (refer to FIG. 6) is to be included, for example, within an angular range within ±15 degrees relative to the direction of development of the dislocation present on this sliding surface. In other words, the predetermined direction may be a direction in which the shear stress on the (0001) plane is to be generated in an angular direction within, for example, ±15 degrees with respect to the <-1100> direction in the crystal orientation of the SiC substrate 21.

However, the predetermined direction is not limited to such a direction and various modifications can be made as long as the direction has a component tensile in the <-1100> direction in the crystal orientation of the SiC substrate 21. In addition, the tensile force applied at this time is also controlled by the stress controller 102 based on the pressure value detected by the force sensor 105 to obtain a tensile force that adjusts the stress generated inside the semiconductor devices 20 to a stress equal to or lower than the breakdown stress of the semiconductor devices 20.

Furthermore, in the above-described embodiment, the current application test (step S105 in FIG. 9) involving the application of pressure (the compressive force or the tensile force) is executed on the singulated semiconductor device 20, but the embodiment is not limited to such a configuration. For example, a configuration also can be adopted in which pressure is applied to the SiC wafer 10 in which the semiconductor device 20 before singulation is built such that the current application test is executed on the individual semiconductor device 20 for each of the states before and after pressure is applied. In such a case, the current application test in the wafer state may be executed, for example, in a process between step S103 and step S104 in FIG. 9. Additionally, it is also possible to adopt a configuration in which, in addition to this current application test in the wafer state, the current application test for the singulated semiconductor device 20 exemplified in step S107 in FIG. 9 is also executed.

Second Embodiment

Next, a semiconductor device inspection apparatus, a semiconductor device inspection method, and a semiconductor device inspection program according to a second embodiment will be described in detail with reference to the drawings.

The above-described first embodiment exemplifies a case where, by mechanically applying a weight to the SiC substrate 21 (or the SiC wafer 10) to compress (or stretch), the shear stress on the sliding surface is generated at least in a region from the vicinity of the interface 23 between the SiC substrate 21 and the SiC epitaxial film 22 to the upper surface 24 (refer to FIG. 6). In contrast to this, in the second embodiment, by applying a mechanical load so as to bend the SiC substrate 21 (or the SiC wafer 10), the shear stress on the sliding surface is generated at least in a region from the vicinity of the interface 23 between the SiC substrate 21 and the SiC epitaxial film 22 to the upper surface 24 (refer to FIG. 6).

Figure 10:
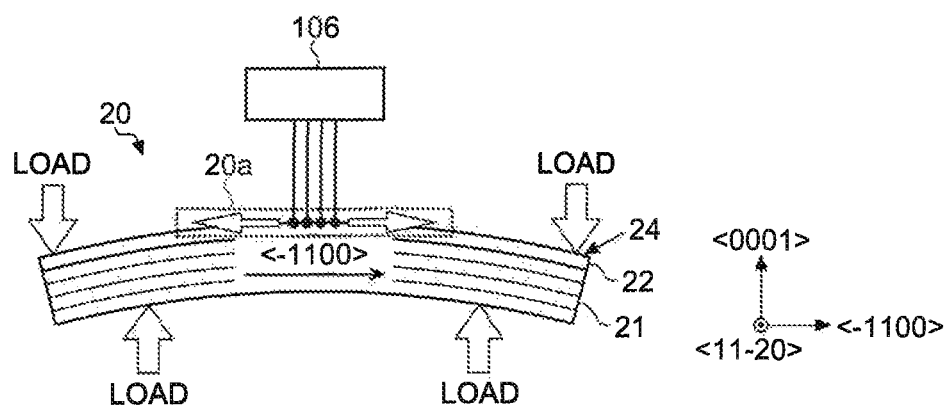
FIG. 10 is a diagram illustrating a schematic configuration example in a case where a semiconductor device is bent such that a tensile stress in a <-1100> direction is generated at least in an element formation region of the semiconductor device in a second embodiment.

FIG. 10 is a diagram illustrating a schematic configuration example in a case where the semiconductor device is bent such that the tensile stress, in the <–1100> direction is generated at least in the element formation region of the semiconductor device. As illustrated in FIG. 10, when a mechanical load is imparted to the semiconductor device 20 such that a side of the semiconductor device 20 on which the element formation region 20a is provided is warped convexly in the <0001> direction on the (11-20) plane, at least in a region from the vicinity of the interface 23 between the SiC substrate 21 and the SiC epitaxial film 22 to the upper surface 24 in the element formation region 20a, the internal stress trying to broaden this region along the <–1100> direction (the shear stress on the sliding surface) is generated. The direction of this internal stress may be a direction included, for example, within an angular range within ±15 degrees relative to the direction of development of the dislocation present on this sliding surface.

Figure 11:
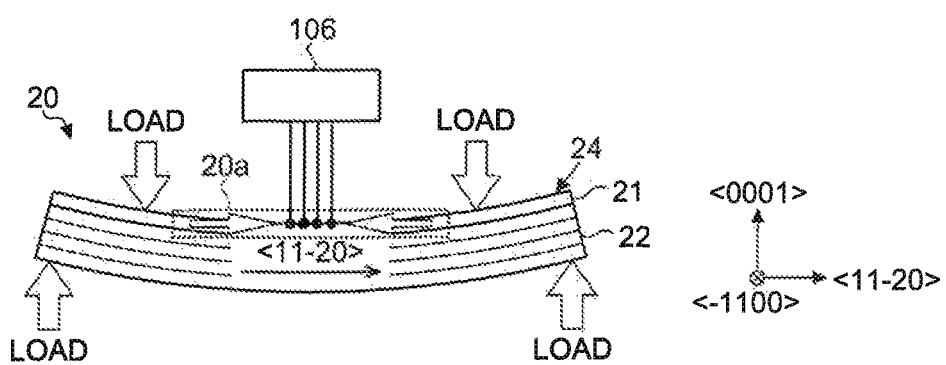
FIG. 11 is a diagram illustrating a schematic configuration example in a case where a semiconductor device is bent such that a compressive stress in the <11-20> direction is generated at least in the element formation region of a semiconductor device in the second embodiment.

Meanwhile, FIG. 11 is a diagram illustrating a schematic configuration example in a case where the semiconductor device is bent such that the compressive stress in the <11-20> direction is generated at least in the element formation region of the semiconductor device. As illustrated in FIG. 11, when a mechanical load is imparted to the semiconductor device 20 such that a side of the semiconductor device 20 on which the element formation region 20a is provided is warped concavely in the <0001> direction on the (–1100) plane, at least in a region from the vicinity of the interface 23 between the SiC substrate 21 and the SiC epitaxial film 22 to the upper surface 24 in the element formation region 20a, the internal stress trying to compress this region along the <11-20> direction (the shear stress on the sliding surface) is generated. The direction of this internal stress may be a direction included, for example, within an angular range within ±15 degrees relative to the direction of development of the dislocation present on this sliding surface.

Also with the above configuration, as in the first embodiment, since the current application test can be executed while the internal stress is generated in the semiconductor device 20, it is possible to specify the semiconductor device 20 with low device characteristics or a high probability of the device characteristics being lowered based on a change in the current threshold value at the occurrence of the stacking fault. This makes it possible to screen the semiconductor device 20 with better device characteristics and, as a result, the reliability of the semiconductor device 20 and a semiconductor apparatus mounting the semiconductor device 20 can be improved.

Note that, although the above description exemplifies a case where the semiconductor device 20 is bent by imparting a mechanical load directly to the semiconductor device 20, a configuration also can be adopted in which, for example, the semiconductor device 20 is secured to a base substrate such as a circuit substrate or a wiring substrate such that a mechanical load is imparted to this base substrate to bend the base substrate and in turn to bend the semiconductor device 20.

Other configurations, operations, and effects are similar to those of the above-described embodiment and accordingly, detailed description thereof will be omitted here.

Third Embodiment

Next, a semiconductor device inspection apparatus, a semiconductor device inspection method, and a semiconductor device inspection program according to a third embodiment will be described in detail with reference to the drawings.

As a means for generating the internal stress in a predetermined direction on the SiC substrate 21 (or the SiC wafer 10), besides a method of applying the compressive force or the tensile force to the SiC substrate 21 (or the SiC wafer 10) in a specific direction as exemplified in the first embodiment and a method of bending the SiC substrate 21 (or the SiC wafer 10) in a specific direction as exemplified in the second embodiment, for example, a method of mounting the SiC substrate 21 (or the SiC wafer 10) on a base substrate having a linear expansion coefficient different from that of the SiC substrate 21 (or the SiC wafer 10) can be considered as will be exemplified in the following third embodiment.

FIG. 12 is a diagram for explaining an internal stress generated in the semiconductor device when the semiconductor device is mounted on a base substrate (for example, a circuit substrate or a wiring substrate) having a linear expansion coefficient larger than that of the SiC substrate. In the example illustrated in FIG. 12(a), the semiconductor device 20 is secured to a base substrate 31 having a linear expansion coefficient larger than the linear expansion coefficient of the SiC substrate 21 in the <11-20> direction. At that time, the processing temperature at the time of securing is adjusted to a temperature (for example, 350° C.) higher than the temperature (for example, the normal temperature) at the time of the current application test. That is, the semiconductor device 20 and the base substrate 31 are secured to each other in respective expanded states according to different linear expansion coefficients. Note that the semiconductor device 20 is secured to the base substrate 31, for example, in a so-called face-up state where an opposite side of the element formation region 20a (refer to FIG. 6) faces a side of the base substrate 31. However, the embodiment is not limited thereto and the semiconductor device 20 may be secured to the base substrate 31, for example, in a face-down state.

Subsequently, as illustrated in FIG. 12(b), during the current application test (step S107 in FIG. 9) for the semiconductor device 20, the semiconductor device 20 secured to the base substrate 31 is placed at a temperature at the time of the current application test (for example, the normal temperature). In this case, the stage 104 may operate as an action unit to control the temperature of the semiconductor device 20 instead of the action units 103 in FIG. 5. Then, the base substrate 31 having a larger linear expansion coefficient shrinks more than the SiC substrate 21 having a smaller linear expansion coefficient as compared with the time of securing and accordingly, a compressive force along the <11-20> direction is applied to the semiconductor device 20 according to a difference in the amount of shrinkage per unit length between the base substrate 31 and the SiC substrate 21.

Note that, taking into account that the linear expansion coefficient of the SiC substrate 21 is approximately 4 to 4.5 ($\times 10^{-6}$/K), various conductive materials, insulating materials, semiconductor materials and the like having, for example, a linear expansion coefficient of approximately $4.5 \times 10^{-6}$/K or more can be used as the material of the base substrate 31.

On the other hand, FIG. 13 is a diagram for explaining an internal stress generated in the semiconductor device when the semiconductor device is mounted on a base substrate having a linear expansion coefficient smaller than that of the SiC substrate. In the example illustrated in FIG. 13(a), the semiconductor device 20 is secured to a base substrate 32 having a linear expansion coefficient smaller than the linear expansion coefficient of the SiC substrate 21 in the <−1100> direction. Note that the semiconductor device 20 may be secured to the base substrate 32 in the face-up state or may be secured to the base substrate 32 in the face-down state. In addition, the processing temperature at the time of securing is adjusted to a temperature (for example, 350° C.) higher than the temperature (for example, the normal temperature) at the time of the current application test.

Also in such a case, as illustrated in FIG. 13(b), when the semiconductor device 20 is placed at a temperature at the time of the current application test (for example, the normal temperature), the SiC substrate 21 having a larger linear expansion coefficient shrinks more than the base substrate 32 having a smaller linear expansion coefficient and accordingly, a tensile force along the <−1100> direction is applied to the semiconductor device 20 according to a difference in the amount of shrinkage per unit length between the base substrate 32 and the SiC substrate 21.

Note that, taking into account that the linear expansion coefficient of the SiC substrate 21 is approximately 4 to 4.5 ($\times 10^{-6}$/K), various conductive materials, insulating materials, semiconductor materials and the like having, for example, a linear expansion coefficient of approximately $4 \times 10^{-6}$/K or less can be used as the material of the base substrate 32.

As described above, also in this embodiment, as in the above-described embodiments, since the current application test can be executed while the internal stress is generated in the semiconductor device 20, it is possible to specify the semiconductor device 20 with low device characteristics or a high probability of the device characteristics being lowered based on a change in the current threshold value at the occurrence of the stacking fault. This makes it possible to screen the semiconductor device 20 with better device characteristics and, as a result, the reliability of the semiconductor device 20 and a semiconductor apparatus mounting the semiconductor device 20 can be improved.

Note that, preferably, the direction of the compressive force or the tensile force applied to the semiconductor device 20 due to the temperature difference between the time of securing and the time of the current application test is regulated to a direction in which the direction of the shear stress on the sliding surface to be generated, for example, at least in an area from the vicinity of the interface 23 between the SiC substrate 21 and the SiC epitaxial film 22 to the upper surface 24 (refer to FIG. 6) is to be included, for example, within an angular range within ±15 degrees relative to the direction of development of the dislocation present on this sliding surface.

Other configurations, operations, and effects are similar to those of the above-described embodiments and accordingly, detailed description thereof will be omitted here.

Fourth Embodiment

Next, a semiconductor apparatus and a manufacturing method therefor according to a fourth embodiment will be described in detail with reference to the drawings.

As mentioned in the above embodiments, when the compressive force or the tensile force is applied to the semiconductor device 20 including the SiC substrate 21 having an off angle in the <11-20> direction with respect to (0001) which is a basal plane, the current threshold value at the occurrence of the stacking fault increases or decreases. Therefore, this embodiment adopts a configuration that constantly applies the compressive force or the tensile force to the semiconductor device 20 such that the current threshold value at the occurrence of the stacking fault increases under the normal state. This makes it possible to suppress the deterioration of the device characteristics due to an increase in the stacking fault and accordingly, the reliability of the semiconductor device 20 and a semiconductor apparatus mounting the semiconductor device 20 can be improved.

FIG. 14 is a diagram illustrating an example of a case where the current threshold value at the occurrence of the stacking fault is increased by adopting a configuration that constantly applies the compressive force in the <−1100> direction to the semiconductor device 20. In this example, as illustrated in FIG. 14(a), a mechanical load is imparted to a base substrate 41 mounting the semiconductor device 20 first such that a device mounting surface of the base substrate 41 is bent so as to warp convexly.

Next, as illustrated in FIG. 14(b), the semiconductor device 20 is fixed to the device mounting surface of the base substrate 41 while a flat surface including the convexly warped cross section of the base substrate 41 and the (11-20) plane in the crystal orientation of the SiC substrate 21 constituting the semiconductor device 20 are coincident with each other. In this case, the semiconductor device 20 is secured to the device mounting surface whose area is extended by warping convexly.

Thereafter, as illustrated in FIG. 14(C), the mechanical load imparted to the base substrate 41 is released. Then, the extended device mounting surface of the base substrate 41 is reduced to the original area, whereby the compressive force in the <−1100> direction is constantly applied to the semiconductor device 20 under the normal state in which the base substrate 41 is not bent. As a result, it is possible to suppress the deterioration of the device characteristics due to an increase in the stacking fault by increasing the current threshold value at the occurrence of the stacking fault and accordingly, the reliability of the semiconductor device 20 and a semiconductor apparatus mounting the semiconductor device 20 can be improved.

On the other hand, FIG. 15 is a diagram illustrating an example of a case where the current threshold value at the occurrence of the stacking fault is increased by adopting a configuration that constantly applies the tensile force in an <11-20> direction to the semiconductor device 20. In this example, as illustrated in FIG. 15(a), a mechanical load is imparted to the base substrate 41 mounting the semiconductor device 20 first such that the device mounting surface of the base substrate 41 is bent so as to warp concavely.

Next, as illustrated in FIG. 15(b), the semiconductor device 20 is fixed to the device mounting surface of the base substrate 41 while a flat surface including the concavely warped cross section of the base substrate 41 and the (−1100) plane in the crystal orientation of the SiC substrate 21 constituting the semiconductor device 20 are coincident with each other. In this case, the semiconductor device 20 is secured to the device mounting surface whose area is reduced by warping concavely.

Thereafter, as illustrated in FIG. 15(c), the mechanical load imparted to the base substrate 41 is released. Then, the reduced device mounting surface of the base substrate 41 is extended to the original area, whereby the tensile force in the <11-20> direction is constantly applied to the semiconductor device 20 under the normal state in which the base substrate 41 is not bent. As a result, it is possible to suppress the deterioration of the device characteristics due to an increase in the stacking fault and accordingly, the reliability of the semiconductor device 20 and a semiconductor apparatus mounting the semiconductor device 20 can be improved.

Note that, in the above-described examples illustrated in FIGS. 14 and 15, the semiconductor device 20 is secured to the base substrate 41, for example, in the face-up state. However, the embodiment is not limited thereto and the semiconductor device 20 may be secured to the base substrate 41, for example, in the face-down state.

In addition, the direction of the compressive force or the tensile force applied to the semiconductor device 20 by releasing the mechanical load that bends the base substrate 41 may be a direction included within an angular range, for example, within ±15 degrees relative to the direction of development of the dislocation present on the sliding surface.

Furthermore, this embodiment is not restricted to a configuration that constantly generates the shear stress on the sliding surface, for example, at least in a region from the vicinity of the interface 23 (refer to FIG. 6) between the SiC substrate 21 and the SiC epitaxial film 22 to the upper surface 24. It is possible to make various modifications such as a configuration that constantly generates the shear stress on the sliding surface, for example, in a branch section (refer to FIG. 4) between the basal plane dislocation (BPD) and the threading edge dislocation (TED) existing in the vicinity of the interface 23 (refer to FIG. 6) between the SiC substrate 21 and the SiC epitaxial film 22.

Other configurations, operations, and effects are similar to those of the above-described embodiments and accordingly, detailed description thereof will be omitted here.

Fifth Embodiment

The fourth embodiment described above exemplifies a configuration in which the base substrate 41 is bent by imparting a mechanical load thereto when the semiconductor device 20 is mounted on the base substrate 41 such that the compressive force or the tensile force in a predetermined direction is constantly applied to the semiconductor device 20 under the normal state, but the embodiment is not limited to such a configuration. For example, as illustrated in FIG. 16 or 17, it is also possible to adopt a configuration in which a base substrate 51 or 52 having a linear expansion coefficient different from that of the semiconductor device 20 is used and the processing temperature when the semiconductor device 20 is mounted on the base substrate 51 or 52 is adjusted to a temperature different from the temperature when the semiconductor device 20 is operated, thereby constantly applying the compressive force or the tensile force in a predetermined direction to the semiconductor device 20 during operation.

Figure 16:
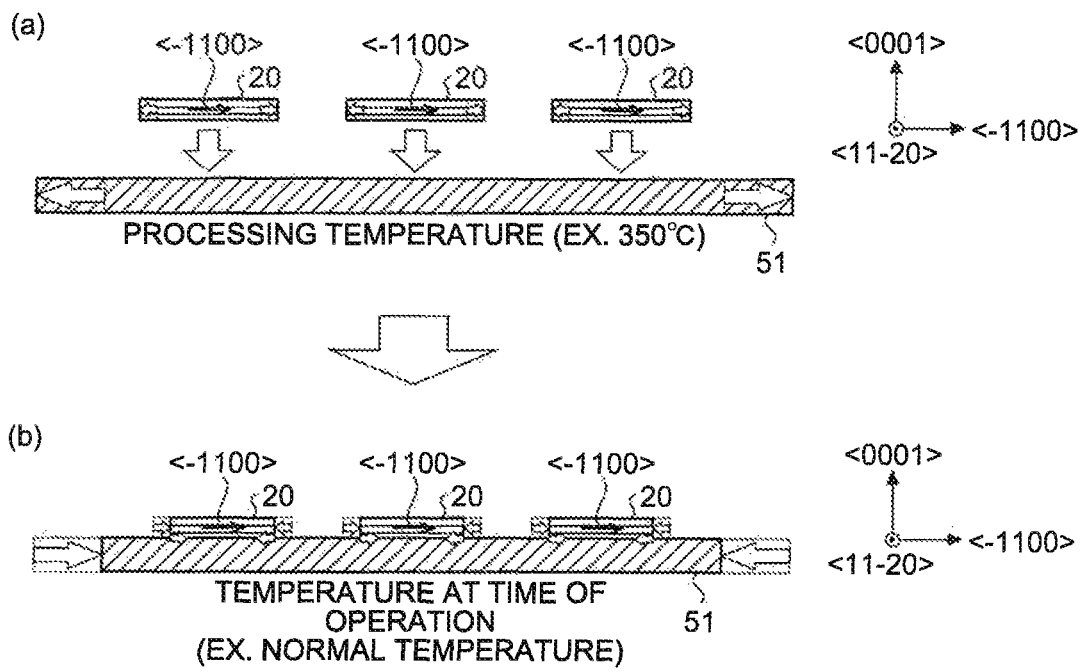
FIG. 16 is a diagram for explaining an example of a semiconductor apparatus according to a fifth embodiment.
Figure 17:
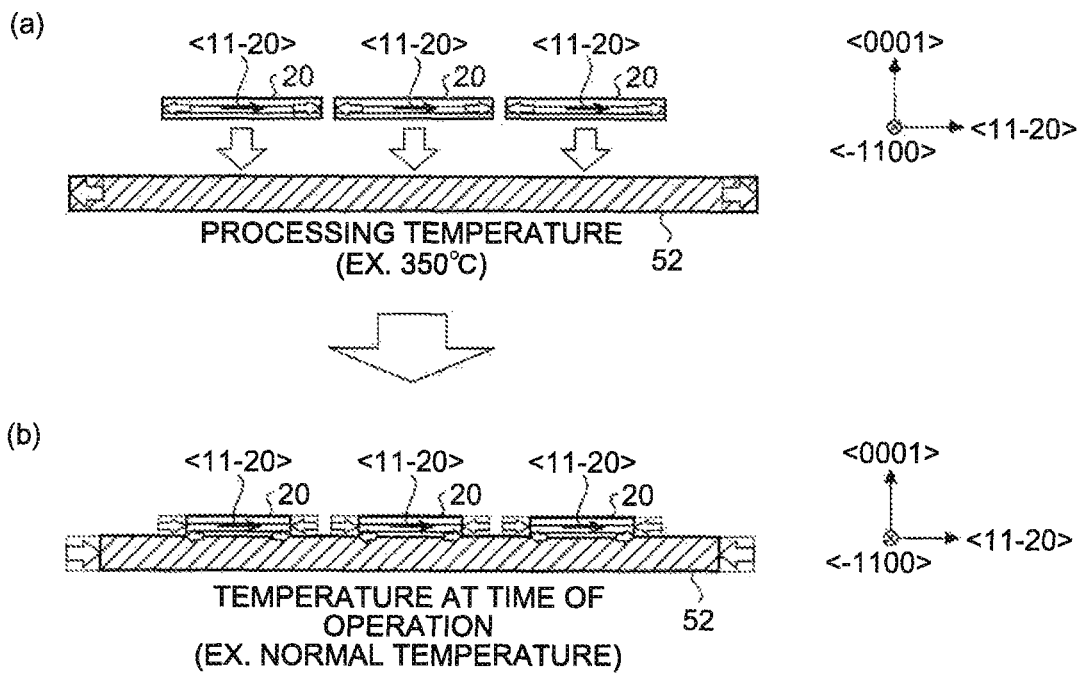
FIG. 17 is a diagram for explaining another example of the semiconductor apparatus according to the fifth embodiment.

FIG. 16 is a diagram illustrating an example of a case where a configuration is adopted in which the compressive force in the <−1100> direction is constantly applied to the semiconductor device by mounting the semiconductor device on a base substrate whose linear expansion coefficient is larger than that of the SiC substrate. In the example illustrated in FIG. 16(a), the semiconductor device 20 is secured to the base substrate 51 having a linear expansion coefficient larger than the linear expansion coefficient of the SiC substrate 21 in the <−1100> direction. Note that the semiconductor device 20 may be secured to the base substrate 51, for example, in the face-up state or may be secured to the base substrate 51, for example, in the face-down state. In addition, the processing temperature at the time of securing is adjusted to a temperature (for example, 350° C.) higher than the temperature (for example, the normal temperature) at the time of the normal operation of the semiconductor device 20. That is, the semiconductor device 20 and the base substrate 51 are secured to each other in respective expanded states according to different linear expansion coefficients.

As illustrated in FIG. 16(b), during the normal operation of the semiconductor device 20, the semiconductor device 20 secured to the base substrate 51 is adjusted to a temperature at the time of the normal operation (for example, the normal temperature). Then, the base substrate 51 having a larger linear expansion coefficient shrinks more than the SiC substrate 21 having a smaller linear expansion coefficient as compared with the time of securing and accordingly, a compressive force along the <−1100> direction is applied to the semiconductor device 20 according to a difference in the amount of shrinkage per unit length between the base substrate 51 and the semiconductor device 20.

Note that, taking into account that the linear expansion coefficient of the SiC substrate 21 is approximately 4 to 4.5 ($\times 10^{-6}$/K), various conductive materials, insulating materials, semiconductor materials and the like having, for example, a linear expansion coefficient of approximately $4.5 \times 10^{-6}$/K or more can be used as the material of the base substrate 51.

On the other hand, FIG. 17 is a diagram illustrating an example of a case where a configuration is adopted in which the tensile force in the <11-20> direction is constantly applied to the semiconductor device by mounting the semiconductor device on a base substrate having a linear expansion coefficient smaller than that of the SiC substrate. In the example illustrated in FIG. 17(a), the semiconductor device 20 is secured to a base substrate 52 having a linear expansion coefficient smaller than the linear expansion coefficient of the SiC substrate 21 in the <11-20> direction. Note that the semiconductor device 20 may be secured to the base substrate 52 in the face-up state or may be secured to the base substrate 52 in the face-down state. In addition, the processing temperature at the time of securing is adjusted to a temperature (for example, 350° C.) higher than the temperature (for example, the normal temperature) at the time of the normal operation.

Also in such a case, since the semiconductor device 20 secured to the base substrate 52 is adjusted to the temperature at the time of the normal operation (for example, the normal temperature), as illustrated in FIG. 17(b), the semiconductor device 20 having a larger linear expansion coefficient shrinks more than the base substrate 52 having a smaller linear expansion coefficient during the normal operation of the semiconductor device 20 as compared with the time of securing. Consequently, a tensile force along the <11-20> direction is applied to the semiconductor device 20 according to a difference in the amount of shrinkage per unit length between the base substrate 52 and the SiC substrate 21.

Note that, taking into account that the linear expansion coefficient of the SiC substrate 21 is approximately 4 to 4.5 ($\times 10^{-6}$/K), various conductive materials, insulating materials, semiconductor materials and the like having, for example, a linear expansion coefficient of approximately $4 \times 10^{-6}$/K or less can be used as the material of the base substrate 52.

In addition, preferably, the direction of the compressive force or the tensile force applied to the semiconductor device 20 due to the temperature difference between the time of securing and the time of the normal operation is regulated to a direction in which the direction of the shear stress on the sliding surface to be generated, for example, at least in an area from the vicinity of the interface 23 between the SiC substrate 21 and the SiC epitaxial film 22 to the upper surface 24 (refer to FIG. 6) is to be included, for example, within an angular range within ±15 degrees relative to the direction of development of the dislocation present on this sliding surface.

Furthermore, this embodiment is not restricted to a configuration that constantly generates the shear stress on the sliding surface or the compressive or tensile stress, for example, at least in a region from the vicinity of the interface 23 (refer to FIG. 6) between the SiC substrate 21 and the SiC epitaxial film 22 to the upper surface 24. It is possible to make various modifications such as a configuration that constantly generates the shear stress on the sliding surface, for example, in a branch section (refer to FIG. 4) between the basal plane dislocation (BPD) and the edge dislocation (TED) existing in the vicinity of the interface 23 (refer to FIG. 6) between the SiC substrate 21 and the SiC epitaxial film 22.

Other configurations, operations, and effects are similar to those of the above-described embodiments and accordingly, detailed description thereof will be omitted here.

Sixth Embodiment

The fourth and fifth embodiments described above exemplify a configuration that constantly applies the compressive force or the tensile force in a predetermined direction to the semiconductor device 20 by utilizing a restoring force of the base substrate 41 against the bending or the difference in the linear expansion coefficients between the base substrate 51 or 52 and the semiconductor device 20, but is not limited to such a configuration. For example, as illustrated in FIG. 18 or 19, it is also possible to adopt a configuration that constantly applies the compressive force or the tensile force in a predetermined direction to the semiconductor device 20 by adopting a configuration in which the base substrate 41 mounting the semiconductor device 20 is bent under the normal state.

FIG. 18 is a diagram illustrating an example of a configuration that constantly applies the tensile force in the <11-20> direction to the semiconductor device while the base substrate is fixed to a support substrate. In this example, first, the semiconductor device 20 is mounted on the base substrate 41 not bent yet, as illustrated in FIG. 18(a). Meanwhile, on the support substrate 61 to which the base substrate 41 is to be fixed, a convex portion 62 is provided, for example, at a position corresponding to a position where the semiconductor device 20 is mounted on the base substrate 41.

When the base substrate 41 is fixed to the support substrate 61, end portions of the base substrate 41 are fixed to the support substrate 61 as illustrated in FIG. 18(b). At that time, a substantially central portion of the base substrate 41 (for example, a bottom face of a portion on which the semiconductor device 20 is mounted) is supported by the convex portion 62 protruding from a mounting surface of the support substrate 61, whereby the base substrate 41 is caused to warp convexly. At this point in time, by warping the base substrate 41 such that a flat surface including the convexly warped cross section of the base substrate 41 and the (-1100) plane in the crystal orientation of the SiC substrate 21 constituting the semiconductor device 20 are coincident with each other, the tensile force in the <11-20> direction can be constantly applied to the semiconductor device 20. As a result, it is possible to suppress the deterioration of the device characteristics due to an increase in the stacking fault and accordingly, the reliability of the semiconductor device 20 and a semiconductor apparatus mounting the semiconductor device 20 can be improved.

On the other hand, FIG. 19 is a diagram illustrating an example of a configuration that constantly applies the compressive force in the <-1100> direction to the semiconductor device while the base substrate is fixed to the support substrate. In this example, first, the semiconductor device 20 is mounted on the base substrate 41 not bent yet, as illustrated in FIG. 19(a). Meanwhile, on the support substrate 61 to which the base substrate 41 is to be fixed, convex portions 63 are provided, for example, at positions corresponding to end portions of the base substrate 41.

When the base substrate 41 is fixed to the support substrate 61, a substantially central portion of the base substrate 41 (for example, a bottom face of a portion on which the semiconductor device 20 is mounted) is fixed to the support substrate 61 as illustrated in FIG. 19(b). At that time, the end portions of the base substrate 41 are supported by the convex portions 63 protruding from the mounting surface of the support substrate 61, whereby the base substrate 41 is caused to warp concavely. At this point in time, by warping the base substrate 41 such that a flat surface including the concavely warped cross section of the base substrate 41 and the (11-20) plane in the crystal orientation of the SiC substrate 21 constituting the semiconductor device 20 are coincident with each other, the compressive force in the <-1100> direction can be constantly applied to the semiconductor device 20. As a result, it is possible to suppress the deterioration of the device characteristics due to an increase in the stacking fault and accordingly, the reliability of the semiconductor device 20 and a semiconductor apparatus mounting the semiconductor device 20 can be improved.

Note that, in the above-described examples illustrated in FIGS. 18 and 19, the semiconductor device 20 is secured to the base substrate 41, for example, in the face-up state. However, the embodiment is not limited thereto and the semiconductor device 20 may be secured to the base substrate 41, for example, in the face-down state.

In addition, the direction of the compressive force or the tensile force applied to the semiconductor device 20 when the base substrate 41 is fixed to the support substrate 61 may be a direction included within an angular range, for example, within ±15 degrees relative to the direction of development of the dislocation present on the sliding surface.

Furthermore, this embodiment is not restricted to a configuration that constantly generates the shear stress on the sliding surface, for example, at least in a region from the vicinity of the interface 23 (refer to FIG. 6) between the SiC substrate 21 and the SiC epitaxial film 22 to the upper surface 24. It is possible to make various modifications such as a configuration that constantly generates the shear stress on the sliding surface, for example, in a branch section (refer to FIG. 4) between the basal plane dislocation (BPD) and the edge dislocation (TED) existing in the vicinity of the interface 23 (refer to FIG. 6) between the SiC substrate 21 and the SiC epitaxial film 22.

Additionally, in the above description, the convex portion 62 or 63 provided on the support substrate 61 is exemplified as a configuration to warp the base substrate 41 convexly or concavely, but the embodiment is not limited to such a configuration. It is also possible to adopt a configuration that applies the compressive force or the tensile force in a predetermined direction to the semiconductor device 20 by fixing the base substrate 41 mounting the semiconductor device 20 to, for example, a support substrate 71 that warps convexly as exemplified in FIG. 20 or a support substrate 72 that warps concavely as exemplified in FIG. 21.

Other configurations, operations, and effects are similar to those of the above-described embodiments and accordingly, detailed description thereof will be omitted here.

Seventh Embodiment

Figure 22A:
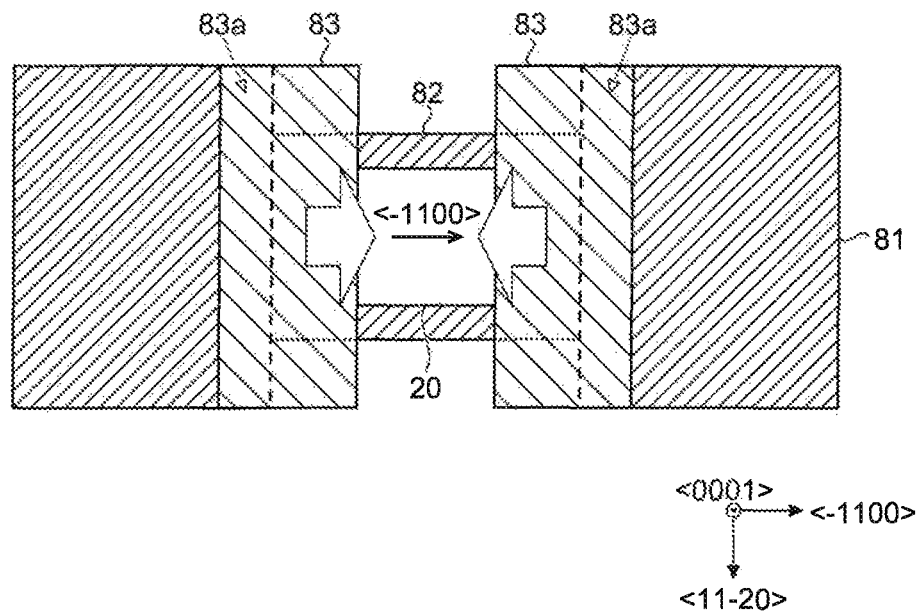
FIGS. 22A and 22B are diagrams illustrating an example of an implementation structure of a semiconductor apparatus according to a seventh embodiment.
Figure 22B:
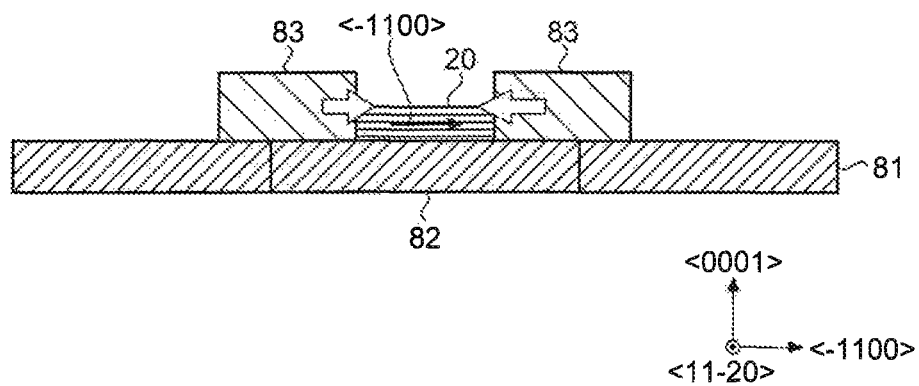

Next, a semiconductor apparatus and a manufacturing method therefor according to a seventh embodiment will be described in detail with reference to the drawings. FIGS. 22A and 22B are diagrams illustrating an example of an implementation structure of the semiconductor apparatus according to this embodiment, where FIG. 22A is a top view thereof and FIG. 22B is a side view thereof.

As illustrated in FIGS. 22A and 22B, in this embodiment, the semiconductor device 20 is mounted on a base substrate 81 by being held by members 83 fixed to the base substrate 81. A constricted portion 82 may be provided in a portion of the base substrate 81 on which the semiconductor device 20 is mounted. Each of the members 83 that hold the semiconductor device 20 is secured to the base substrate 81, for example, in a junction region 83a located on a side opposite to a side in contact with the semiconductor device 20. In this state, an end of each member 83 on the side in contact with the semiconductor device 20 can freely move according to the expansion and the shrinkage of the member 83.

For example, a material such as ceramics having a linear expansion coefficient larger than that of the base substrate 81 is used for each member 83. This makes it possible to apply a force compressing the semiconductor device 20 thereto when the temperature around the semiconductor device 20 rises, for example, due to heat emitted by the semiconductor device 20 during operation or a rise of the temperature of the external environment. At this point in time, by aligning the <−1100> direction in the crystal orientation of the SiC substrate 21 of the semiconductor device 20 with a direction in which the semiconductor device 20 is sandwiched between the two members 83, it is possible to configure such that the compressive force in the <−1100> direction is generated in the semiconductor device 20 during operation. As a result, it is possible to suppress the deterioration of the device characteristics due to an increase in the stacking fault during operation and accordingly, the reliability of the semiconductor device 20 and a semiconductor apparatus mounting the semiconductor device 20 can be improved.

Note that the above description exemplifies a case where the compressive force in a direction in which the semiconductor device 20 is sandwiched between the two members 83 is generated in the semiconductor device 20, but is not limited thereto. For example, in a case where each member 83 and the semiconductor device 20 are secured to each other and a material having a linear expansion coefficient smaller than that of the base substrate 31 is used for each member 83, a force in a direction to stretch the semiconductor device 20 is applied thereto when the temperature around the semiconductor device 20 rises due to heat emitted by the semiconductor device 20 during operation or a rise of the temperature of the external environment. In that case, by aligning the <11-20> direction in the crystal orientation of the SiC substrate 21 of the semiconductor device 20 with a direction in which the semiconductor device 20 is sandwiched between the two members 83, it is possible to configure such that the tensile force in the <11-20> direction is generated in the semiconductor device 20 during operation. As a result, it is possible to suppress the deterioration of the device characteristics due to an increase in the stacking fault during operation and accordingly, the reliability of the semiconductor device 20 and a semiconductor apparatus mounting the semiconductor device 20 can be improved.

In addition, preferably, the direction of the compressive force or the tensile force applied to the semiconductor device 20 due to the expansion of the member 83 is regulated to a direction in which the direction of the shear stress on the sliding surface to be generated, for example, at least in an area from the vicinity of the interface 23 between the SiC substrate 21 and the SiC epitaxial film 22 to the upper surface 24 (refer to FIG. 6) is to be included, for example, within an angular range within ±15 degrees relative to the direction of development of the dislocation present on this sliding surface.

Furthermore, this embodiment is not limited to a configuration that constantly generates the shear stress on the sliding surface, for example, at least in a region from the vicinity of the interface 23 (refer to FIG. 6) between the SiC substrate 21 and the SiC epitaxial film 22 to the upper surface 24. It is possible to make various modifications such as a configuration that constantly generates the shear stress on the sliding surface, for example, in a branch section (refer to FIG. 4) between the basal plane dislocation (BPD) and the edge dislocation (TED) existing in the vicinity of the interface 23 (refer to FIG. 6) between the SiC substrate 21 and the SiC epitaxial film 22.

Other configurations, operations, and effects are similar to those of the above-described embodiments and accordingly, detailed description thereof will be omitted here.

Eighth Embodiment

Figure 23A:
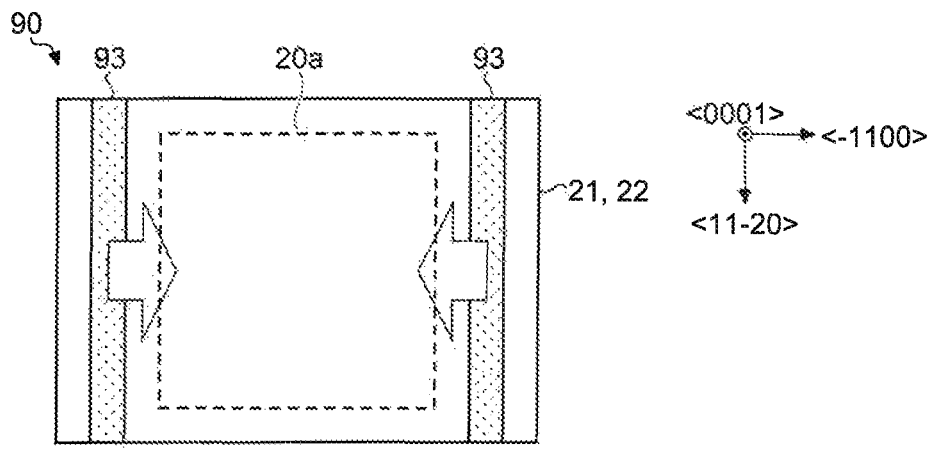
FIGS. 23A and 23B are diagrams illustrating a schematic configuration example of a semiconductor apparatus according to an eighth embodiment.
Figure 23B:
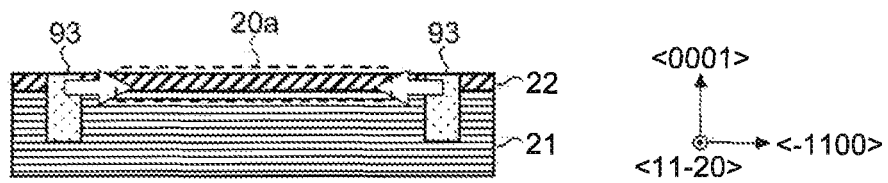

Next, a semiconductor apparatus and a manufacturing method therefor according to an eighth embodiment will be described in detail with reference to the drawings. FIGS. 23A and 23B are diagrams illustrating a schematic configuration example of the semiconductor apparatus according to this embodiment, where FIG. 23A is a top view thereof and FIG. 23B is a cross-sectional view thereof along the <−1100> direction.

As illustrated in FIGS. 23A and 23B, the semiconductor apparatus 90 according to this embodiment includes two diffusion regions 93 provided at positions sandwiching the element formation region 20a in the SiC substrate 21, into which impurities different from those of the element formation region 20a are injected. The impurity injected into the diffusion region 93 may be, for example, an impurity that makes the linear expansion coefficient of the diffusion region 93 larger than the linear expansion coefficient of the SiC substrate 21.

By providing the diffusion regions 93 having a linear expansion coefficient larger than that of the SiC substrate 21 at positions sandwiching the element formation region 20a in this manner, a force in a direction to compress the element formation region 20a is generated therein when the temperature around the element formation region 20a rises, for example, due to heat emitted by the semiconductor apparatus 90 during operation or a rise of the temperature of external environmental. Therefore, by providing the two diffusion regions 93 at positions sandwiching the element formation region 20a in the <−1100> direction in the crystal orientation of the SiC substrate 21, it is possible to configure such that the compressive force in the <−1100> direction is generated in the element formation region 20a during operation. As a result, it is possible to suppress the deterioration of the device characteristics due to an increase in the stacking fault during operation and accordingly, the reliability of the semiconductor apparatus 90 and a semiconductor apparatus mounting the semiconductor apparatus 90 can be improved.

Note that the above description exemplifies a case where the diffusion region 93 having a linear expansion coefficient larger than the linear expansion coefficient of the SiC substrate 21 is provided to generate a force to compress the element formation region 20a during operation, but the embodiment is not limited thereto. For example, by providing the diffusion region 93 having a linear expansion coefficient smaller than the linear expansion coefficient of the SiC substrate 21, it is also possible to configure such that a force to stretch the element formation region 20a is generated during operation. In this case, the diffusion region 93 is formed in the SiC substrate 21 such that the direction of the tensile force is adjusted to the <11-20> direction in the crystal orientation of the SiC substrate 21.

Figure 24A:
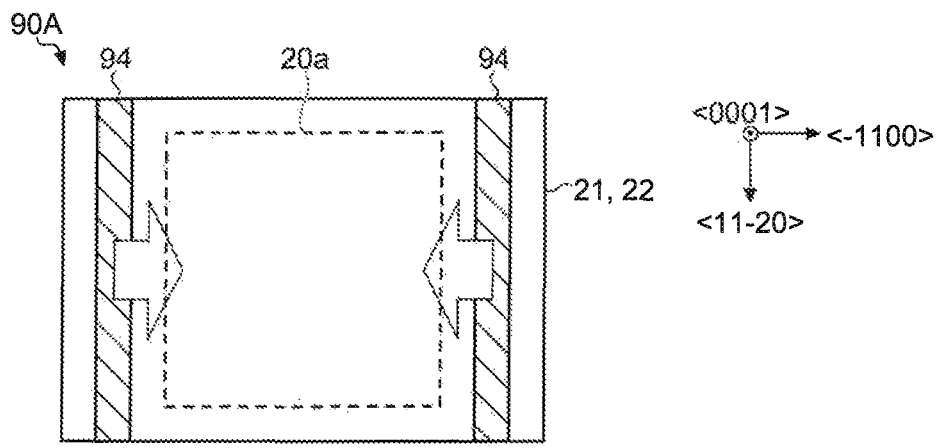
FIGS. 24A and 24B are diagrams illustrating a schematic configuration example of a semiconductor apparatus according to a modification of the eighth embodiment.
Figure 24B:
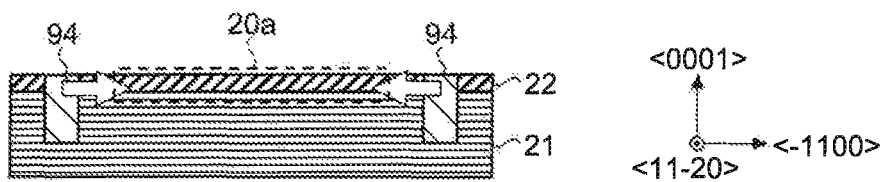

In addition, the above description exemplifies a case where the diffusion region 93 having a linear expansion coefficient different from that of the SiC, substrate 21 is formed by injecting impurities into the SiC substrate 21, but the embodiment is not limited thereto. For example, as indicated by a semiconductor apparatus 90A in FIGS. 24A and 24B, a trench may be formed in the SiC substrate 21 instead of the diffusion region 93 such that a highly rigid embedded member 94 having a linear expansion coefficient different from that of the SiC substrate 21 is embedded in this trench. Also in this case, the compressive force or the tensile force in a predetermined direction can be generated in the element formation region 20a during operation as in the case where the diffusion region 93 is formed. As a result, it is possible to suppress the deterioration of the device characteristics due to an increase in the stacking fault during operation and accordingly, the reliability of the semiconductor apparatus 90 and a semiconductor apparatus mounting the semiconductor apparatus 90A can be improved. Note that FIG. 24A is a top view of the semiconductor apparatus 90A and FIG. 24B is a cross-sectional view thereof along the <11-20> direction.

In addition, preferably, the direction of the compressive force or the tensile force applied to the element formation region 20a of the semiconductor apparatus 90 or 90A due to the expansion of the diffusion region 93 or the embedded member 94 is regulated to a direction in which the direction of the shear stress on the sliding surface to be generated, for example, at least in an area from the vicinity of the interface 23 between the SiC substrate 21 and the SiC epitaxial film 22 to the upper surface 24 (refer to FIG. 6) is to be included, for example, within an angular range within ±15 degrees relative to the direction of development of the dislocation present on this sliding surface.

Furthermore, this embodiment is not limited to a configuration that constantly generates the shear stress on the sliding surface, for example, at least in a region from the vicinity of the interface 23 (refer to FIG. 6) between the SiC substrate 21 and the SiC epitaxial film 22 to the upper surface 24. It is possible to make various modifications such as a configuration that constantly generates the shear stress on the sliding surface, for example, in a branch section (refer to FIG. 4) between the basal plane dislocation (BPD) and the edge dislocation (TED) existing in the vicinity of the interface 23 (refer to FIG. 6) between the SiC substrate 21 and the SiC epitaxial film 22.

Other configurations, operations, and effects are similar to those of the above-described embodiments and accordingly, detailed description thereof will be omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device inspection apparatus comprising:
    an action unit that applies a mechanical force to a semiconductor device to generate an internal stress in a predetermined direction in the semiconductor device;
    a stress controller that controls a magnitude of the internal stress generated in the semiconductor device by the action unit;
    a probe including electrodes electrically connected to the semiconductor device;
    a probe controller that supplies a current to the semiconductor device via the probe; and
    a controller that screens the semiconductor device based on a first current flowing through the semiconductor device via the probe while the internal stress is not generated in the semiconductor device and a second current flowing through the semiconductor device via the probe while the action unit generates the internal stress in the semiconductor device.

2. The semiconductor device inspection apparatus according to claim 1, wherein
the semiconductor device includes: a silicon carbide substrate whose first surface as an upper surface has an off angle with respect to a basal plane of a crystal; a silicon carbide film formed on the first surface of the silicon carbide substrate; and an element formation region provided in an area from the silicon carbide film to an upper layer of the silicon carbide substrate, and
the internal stress is a shear stress on a sliding surface of the silicon carbide substrate or the silicon carbide film.

3. The semiconductor device inspection apparatus according to claim 2, wherein the action unit imparts a mechanical load to the semiconductor device such that the internal stress in the predetermined direction is generated at least in a region from the vicinity of an interface between the silicon carbide film and the silicon carbide substrate to an upper surface of the silicon carbide film.

4. The semiconductor device inspection apparatus according to claim 2, wherein the action unit imparts a mechanical load to the semiconductor device such that the internal stress in the predetermined direction is generated at least near a branch portion between a basal plane dislocation and an edge dislocation existing in the vicinity of an interface between the silicon carbide film and the silicon carbide substrate.

5. The semiconductor device inspection apparatus according to claim 2, wherein the predetermined direction is a direction included in an angular range of ±15 degrees relative to a direction of development of a dislocation occurring in the region from the vicinity of the interface to the upper surface.

6. The semiconductor device inspection apparatus according to claim 2, wherein the predetermined direction is a direction included in a range of ±15 degrees with respect to an <11-20> direction or a <-1100> direction in a crystal orientation of the silicon carbide substrate or the silicon carbide film.

7. The semiconductor device inspection apparatus according to claim 1, wherein the action unit generates the internal stress in the predetermined direction in the semiconductor device by applying a compressive force or a tensile force to the semiconductor device.

8. The semiconductor device inspection apparatus according to claim 1, wherein the action unit generates the internal stress in the predetermined direction in the semiconductor device by warping the semiconductor device.

9. The semiconductor device inspection apparatus according to claim 2, wherein
the semiconductor device is secured to a base substrate having a linear expansion coefficient different from a linear expansion coefficient of the silicon carbide substrate, and
the action unit generates the internal stress in the predetermined direction in the semiconductor device by controlling a temperature of the semiconductor device to a temperature different from a temperature when the semiconductor device is secured to the base substrate.

10. The semiconductor device inspection apparatus according to claim 2, wherein the silicon carbide film is a film formed by an epitaxial growth method.

11. A semiconductor device inspection method comprising:
applying a mechanical force to a semiconductor device to generate an internal stress in a predetermined direction in the semiconductor device;
measuring a first current flowing through the semiconductor device via a probe including electrodes electrically connected to the semiconductor device while the internal stress in the predetermined direction is not generated;
measuring a second current flowing through the semiconductor device via the probe while the internal stress in the predetermined direction is generated in the semiconductor device; and
screening the semiconductor device based on the first current and the second current.

12. A computer program product having a computer readable medium including programmed instructions, wherein the instructions, when executed by a computer, cause the computer to perform:
a step of causing an action unit to apply a mechanical force to a semiconductor device to generate an internal stress in the semiconductor device;
a step of measuring a first current flowing through the semiconductor device via a probe including electrodes electrically connected to the semiconductor device while the action unit does not generate the internal stress in the semiconductor device;
a step of controlling a magnitude of the internal stress generated in the semiconductor device by the action unit;
a step of measuring a second current flowing through the semiconductor device via the probe while the action unit generates the internal stress in the semiconductor device; and
a step of screening the semiconductor device based on the first current and the second current.

* * * * *